(12) United States Patent
Wood et al.

(10) Patent No.: US 7,833,832 B2
(45) Date of Patent: Nov. 16, 2010

(54) METHOD OF FABRICATING SEMICONDUCTOR COMPONENTS WITH THROUGH INTERCONNECTS

(75) Inventors: Alan G. Wood, Boise, ID (US); Warren M. Farnworth, Nampa, ID (US); David R. Hembree, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/412,906

(22) Filed: Mar. 27, 2009

(65) Prior Publication Data

US 2009/0224404 A1 Sep. 10, 2009

Related U.S. Application Data

(62) Division of application No. 11/647,072, filed on Dec. 28, 2006, now Pat. No. 7,538,413.

(51) Int. Cl.
*H01L 21/00* (2006.01)
*H01L 29/06* (2006.01)
*H05K 1/03* (2006.01)

(52) U.S. Cl. .......... 438/109; 438/629; 438/667; 174/255; 174/262; 257/623; 257/774; 257/E23.009; 257/E21.502; 257/E25.021

(58) Field of Classification Search .......... None
See application file for complete search history.

(56) References Cited

U.S. PATENT DOCUMENTS

| | | | |
|---|---|---|---|
| 4,394,712 A | 7/1983 | Anthony | |
| 4,897,708 A | 1/1990 | Clements | |
| 5,229,647 A | 7/1993 | Gnadinger | |
| 5,432,999 A | 7/1995 | Capps | |
| 5,851,911 A | 12/1998 | Farnworth | |
| 6,294,837 B1 | 9/2001 | Akram et al. | |
| 6,380,555 B1 | 4/2002 | Hembree et al. | |
| 6,395,581 B1 | 5/2002 | Choi | |
| 6,400,172 B1 | 6/2002 | Akram et al. | |
| 6,444,576 B1 | 9/2002 | Kong | |
| 6,465,877 B1 | 10/2002 | Farnworth et al. | |
| 6,483,718 B2 | 11/2002 | Hashimoto | |

(Continued)

OTHER PUBLICATIONS

Office Action dated Jul. 25, 2008 from U.S. Appl. No. 11/647,072.

(Continued)

*Primary Examiner*—Alonzo Chambliss
(74) *Attorney, Agent, or Firm*—Stephen A. Gratton

(57) ABSTRACT

A method for fabricating a semiconductor component with through interconnects can include the steps of providing a semiconductor substrate with substrate contacts, and forming openings from a backside of the substrate aligned with the substrate contacts. The method can also include the steps of providing an interposer substrate (or alternately a second semiconductor substrate), forming projections on the interposer substrate (or on the second semiconductor substrate), and forming conductive vias in the projections. The method can also include the steps of placing the projections in physical contact with the openings, and placing the conductive vias in electrical contact with the substrate contacts. The method can also include the steps of bonding the conductive vias to the substrate contacts, and forming terminal contacts on the interposer substrate (or alternately on one of the semiconductor substrates) in electrical communication with the conductive vias.

59 Claims, 11 Drawing Sheets

U.S. PATENT DOCUMENTS

| | | | |
|---|---|---|---|
| 6,521,483 B1 | 2/2003 | Hashimoto | |
| 6,545,228 B2 | 4/2003 | Hashimoto | |
| 6,548,325 B2 | 4/2003 | Pogge | |
| 6,582,992 B2 | 6/2003 | Poo et al. | |
| 6,611,052 B2 | 8/2003 | Poo et al. | |
| 6,620,633 B2 | 9/2003 | Hembree et al. | |
| 6,620,731 B1 | 9/2003 | Farnworth et al. | |
| 6,638,792 B2 | 10/2003 | Hui et al. | |
| 6,803,303 B1 | 10/2004 | Hiatt et al. | |
| 6,828,175 B2 | 12/2004 | Wood et al. | |
| 6,833,613 B1 | 12/2004 | Akram et al. | |
| 6,841,883 B1 | 1/2005 | Farnworth et al. | |
| 6,848,177 B2 | 2/2005 | Swann et al. | |
| 6,881,648 B2 | 4/2005 | Chen et al. | |
| 6,897,089 B1 | 5/2005 | Farnworth et al. | |
| 6,903,442 B2 | 6/2005 | Wood et al. | |
| 6,906,418 B2 | 6/2005 | Hiatt et al. | |
| 6,908,784 B1 | 6/2005 | Farnworth et al. | |
| 6,911,355 B2 | 6/2005 | Farnworth et al. | |
| 6,917,090 B2 | 7/2005 | Moden | |
| 6,954,000 B2 | 10/2005 | Hembree et al. | |
| 6,964,915 B2 | 11/2005 | Farnworth et al. | |
| 6,975,037 B2 | 12/2005 | Farnworth et al. | |
| 6,998,344 B2 | 2/2006 | Akram et al. | |
| 6,998,717 B2 | 2/2006 | Farnworth et al. | |
| 7,029,949 B2 | 4/2006 | Farnworth et al. | |
| 7,060,526 B2 | 6/2006 | Farnworth et al. | |
| 7,078,266 B2 | 7/2006 | Wood et al. | |
| 7,078,922 B2 | 7/2006 | Kirby | |
| 7,081,665 B2 | 7/2006 | Wood et al. | |
| 7,105,918 B2 | 9/2006 | Lee | |
| 7,115,982 B2 | 10/2006 | Moxham | |
| 7,307,348 B2 | 12/2007 | Wood et al. | |
| 7,371,676 B2 | 5/2008 | Hembree | |
| 7,393,770 B2 | 7/2008 | Wood et al. | |
| 7,397,129 B2 | 7/2008 | Lee | |
| 7,409,762 B2 | 8/2008 | Kirby | |
| 7,422,978 B2 | 9/2008 | Lee | |
| 7,538,413 B2 * | 5/2009 | Wood et al. | 257/623 |
| 2003/0230805 A1 | 12/2003 | Noma et al. | |
| 2007/0167000 A1 | 7/2007 | Wood et al. | |
| 2007/0200255 A1 | 8/2007 | Hembree | |
| 2007/0202617 A1 | 8/2007 | Hembree | |
| 2007/0222054 A1 | 9/2007 | Hembree | |
| 2007/0246819 A1 | 10/2007 | Hembree | |
| 2008/0042247 A1 | 2/2008 | Wood et al. | |
| 2008/0157361 A1 | 7/2008 | Wood et al. | |
| 2008/0203539 A1 | 8/2008 | Wood et al. | |
| 2008/0206990 A1 | 8/2008 | Wood et al. | |
| 2008/0229573 A1 | 9/2008 | Wood et al. | |

OTHER PUBLICATIONS

Office Action dated Oct. 17, 2008 from U.S. Appl. No. 11/647,072.
Notice of Allowances dated Mar. 6, 2009 and Jan. 27, 2009 from U.S. Appl. No. 11/647,072.

* cited by examiner

METHOD OF FABRICATING SEMICONDUCTOR COMPONENTS WITH THROUGH INTERCONNECTS

CROSS REFERENCE TO RELATED APPLICATIONS

This application is a division of application Ser. No. 11/647,072, filed Dec. 28, 2006, U.S. Pat. No. 7,538,413.

BACKGROUND

In semiconductor manufacture, packaging is the final operation that transforms a semiconductor substrate into a functional semiconductor component. Typically, the semiconductor substrate is in the form of a semiconductor die. Packaging provides protection for the semiconductor substrate, a signal transmission system for the integrated circuits on the semiconductor substrate, and external connection points for the component. In response to the demand for smaller, lighter and thinner consumer products, new semiconductor components and new packaging methods are being developed. The new components include high pin count single die packages, such as fine ball grid array (FBGA) packages, and multi dice packages, such as stacked packages and systems in a package (SIP).

In fabricating semiconductor components, it is sometimes necessary to provide interconnects which transmit signals from a circuit side of a semiconductor substrate to the backside of the semiconductor substrate. Interconnects which extend through the semiconductor substrate from the circuit side to the backside are sometimes referred to as through interconnects. Typically through interconnects comprise metal filled vias formed in the semiconductor substrate, which are configured to electrically connect the integrated circuits on the circuit side to elements on a backside of the semiconductor substrate.

As semiconductor components become smaller and have higher input/output configurations, semiconductor manufacturers must fabricate through interconnects with increasingly smaller sizes and pitches, but without compromising the performance and reliability of the signal transmission system. In addition, it is preferable for through interconnects to be capable of volume manufacture using equipment and techniques that are known in the art.

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

As used herein, "semiconductor component" means an electronic element that includes a semiconductor substrate or makes contact with a semiconductor substrate. "Semiconductor substrate" means an electronic element, such as a semiconductor die, or a semiconductor package that includes integrated circuits and semiconductor devices. "Interconnect" means an electrical element which electrically connects different electrical elements and transmits signals between these elements. "Wafer-level" means a process conducted on an element, such as a semiconductor wafer, containing multiple semiconductor components or substrates. "Die level" means a process conducted on a singulated element, such as a singulated semiconductor die or package. "Chip scale" means having an outline about the same as that of a semiconductor die. "Wafer size" means having an outline about the same as that of a semiconductor wafer.

Figure 1A:
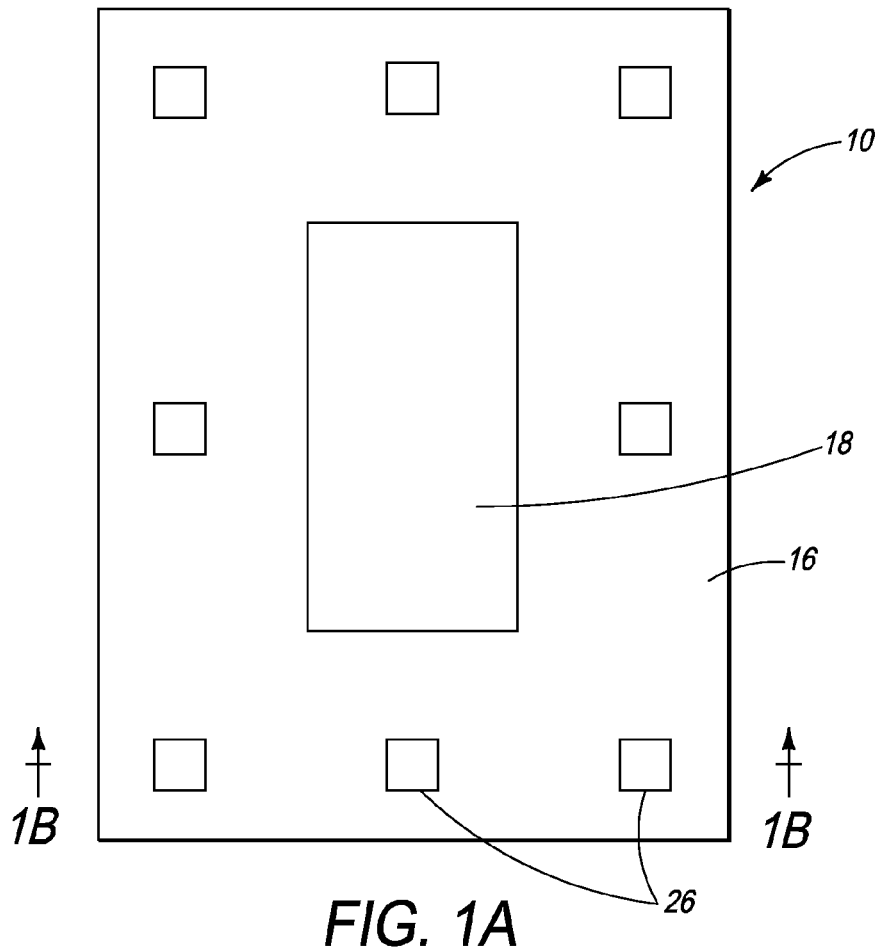
FIG. 1A is a schematic plan view of a semiconductor component having through interconnects.
Figure 1B:
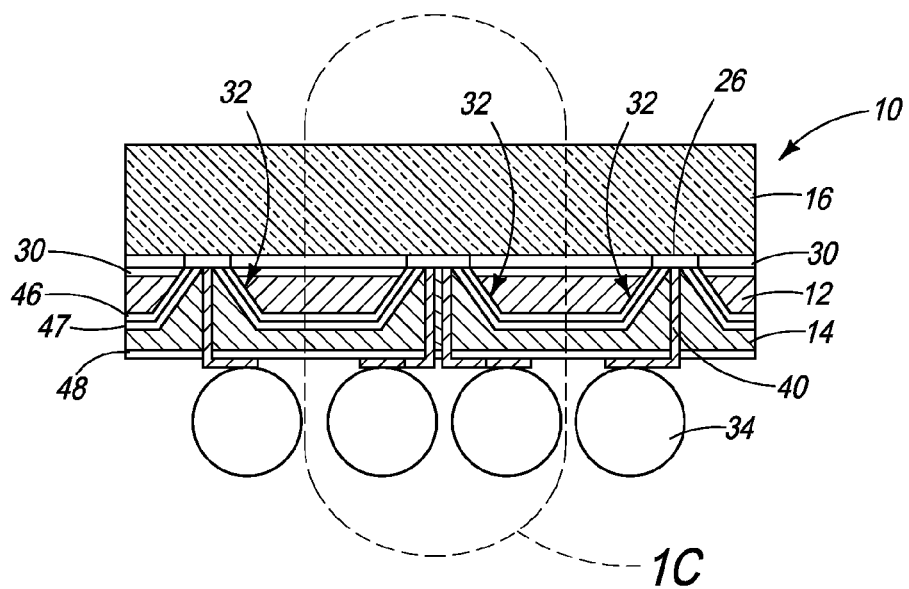
FIG. 1B is a schematic cross sectional view of the semiconductor component taken along section line 1B-1B of FIG. 1A.

Referring to FIGS. 1A-1F, a semiconductor component 10 (FIG. 1A) is illustrated. The semiconductor component 10 (FIG. 1A) includes a semiconductor substrate 12 (FIG. 1B); an interposer substrate 14 (FIG. 1B); and a transparent substrate 16 (FIG. 1B). In the claims to follow the semiconductor substrate 12 (FIG. 1B) is referred to as the "first substrate", the interposer substrate 14 (FIG. 1B) is referred to as the "second substrate", and the transparent substrate 16 (FIG.

1B) is referred to as the "third substrate". As will be further explained, the depth D (FIG. 1C) of each substrate opening 36 (FIG. 1C) is approximately equal to the semiconductor component 10 (FIG. 1A).

In FIGS. 1A-1F, the semiconductor component 10 (FIG. 1A) comprises a microelectronic imager component. In addition, the semiconductor substrate 12 (FIG. 1B) comprises an imager die having a pixel array 18 (FIG. 1A), and a plurality of integrated circuits 20 (FIG. 1C) in electrical communication with the pixel array 18 (FIG. 1A). Also in the semiconductor component 10 (FIG. 1A), the interposer substrate 14 comprises a passive element having no active semiconductor devices. However, for alternate embodiment components to be hereinafter described, alternate embodiment interposer substrates can include active semiconductor devices. The transparent substrate 16 (FIG. 1B) can comprise glass, silicon or a composite material (silicon on glass), configured to protect the pixel array 18 (FIG. 1A) on the semiconductor substrate 12 (FIG. 1B), while allowing light to access the pixel array 18 (FIG. 1A). Further, the transparent substrate 16 can include a lens structure configured to focus radiation onto the radiation sensitive integrated circuits in the pixel array 18. Still further, the transparent substrate 16 can include one or more opaque areas configured to allow specific areas of the pixel array 18 to be accessed.

Rather than being an imager die, the semiconductor substrate 12 (FIG. 1B) can comprise another type of semiconductor die having integrated circuits constructed in a desired electrical configuration using active semiconductor devices. For example, the semiconductor substrate 12 (FIG. 1B) can comprise a high speed digital logic device, such as a dynamic random access memory (DRAM), a static random access memory (SRAM), a flash memory, a microprocessor, a digital signal processor (DSP), an application specific integrated circuit (ASIC), a MEMS type device (e.g., accelerometer, microphone, speaker, electro mechanical device), or a solar cell.

Figure 1C:
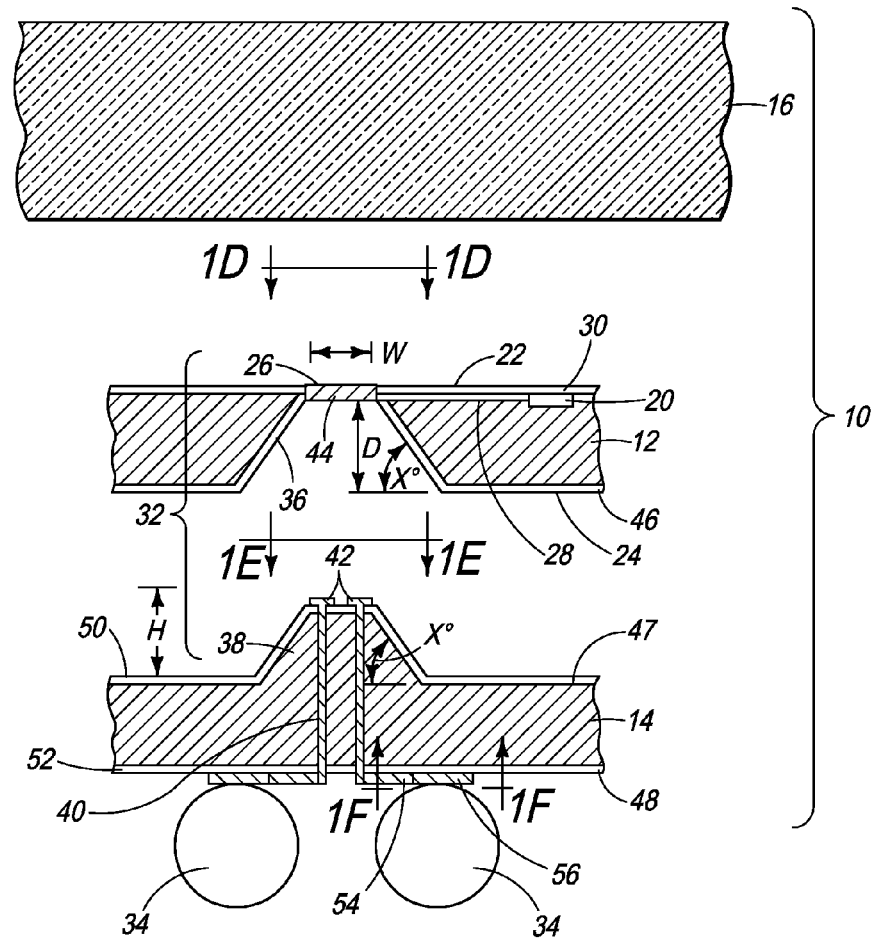
FIG. 1C is an exploded view of a portion of the semiconductor component taken along line 1C of FIG. 1B a through interconnect.

As shown in FIG. 1A, both the semiconductor component 10, and the semiconductor substrate 12 can have a generally rectangular chip scale outline with opposed lateral edges and opposed longitudinal edges. Alternately, the semiconductor component 10 and the semiconductor substrate 12 (FIG. 1A) can have any polygonal shape, such as square or triangular, and can also have a circular or oval shape. In addition, the semiconductor substrate 12 can comprise a full thickness semiconductor die or a thinned semiconductor die. By way of example a thickness of the semiconductor substrate 12 can be from about 10 µm to 725 µm. Since the semiconductor substrate 12 is supported and rigidified by the interposer substrate 14, it can be made very thin. As shown in FIG. 1C, the semiconductor substrate 12 includes a circuit side 22 ("first side" in some of the claims), and a back side 24 ("second side" in some of the claims).

As also shown in FIG. 1B, the semiconductor substrate 12 includes a plurality of substrate contacts 26 on the circuit side 22 in electrical communication with the integrated circuits 20 (FIG. 1C) on the semiconductor substrate 12. The substrate contacts 26 can comprise device bond pads, or alternately redistribution contacts (i.e., contacts formed in conjunction with a redistribution layer (RDL)). In addition, the substrate contacts 26 can comprise a highly-conductive, bondable metal, such as aluminum or copper. The substrate contacts 26 can also comprise stacks of different metals, such as aluminum-nickel-gold, aluminum-nickel-solder, copper-palladium, and aluminum on copper.

For some applications, at least some of the substrate contacts 26 (FIG. 1A) can comprise special purpose contacts. For example, the substrate contacts 26 can comprise electrically isolated contacts, that are not in electrical communication with the integrated circuits 20 (FIG. 1C) on the semiconductor substrate 12. This concept can be employed in stacked components to reduce unwanted capacitance, noise, bleed off voltage and bleed off current.

For simplicity, the semiconductor substrate 12 (FIG. 1B) is illustrated with only eight substrate contacts 26 (FIG. 1A) arranged in an edge array along the peripheral edges of the semiconductor substrate 12. However, in actual practice the semiconductor substrate 12 (FIG. 1B) can include tens of substrate contacts 26 (FIG. 1A) arranged in a desired configuration, such as a center array, an edge array or an area array. Also in the illustrative embodiment, the substrate contacts 26 (FIG. 1A) have a generally square peripheral outline. However, as with the semiconductor substrate 12 (FIG. 1B), the substrate contacts 26 (FIG. 1A) can have any polygonal shape including square, rectangular, circular, triangular and oval. In addition, a size of the substrate contacts 26 (FIG. 1A) can be selected as required. For example, each substrate contact 26 (FIG. 1A) can have a width on each side of from about 5 µm to 200 µm. Further, each substrate contact 26 (FIG. 1A) can comprise a generally planar pad as shown, or can have other shapes such as a projection, a bump or a volcano shape.

As shown in FIG. 1C, the substrate contacts 26 can be in electrical communication with internal conductors 28 located within the semiconductor substrate 12 proximate to the circuit side 22. In addition, the internal conductors 28 are in electrical communication with the integrated circuits 20 in the semiconductor substrate 12. The internal conductors 28 (FIG. 1C) can be part of the internal structure of the semiconductor substrate 12, and can comprise a highly conductive metal, such as aluminum or copper. Further, an electrical insulation layer 30 (FIG. 1C) on the circuit side 22 protects the internal conductors 28 (FIG. 1C) and the integrated circuits 20 (FIG. 1C). The insulation layer 30 (FIG. 1C) can comprise an electrically insulating material, such as BPSG (borophosphosilicate glass), a polymer (e.g., polyimide) or an oxide ($SiO_2$). All of the elements of the semiconductor substrate 12 including the integrated circuits 20 (FIG. 1C), the internal conductors 28 (FIG. 1C), the insulation layer 30 (FIG. 1C), and the pixel array 18 (FIG. 1A) can be formed using well known semiconductor fabrication processes. The semiconductor substrate 12 can also comprise a tested die that has been certified as a known good die (KGD).

As shown in FIG. 1C, the semiconductor component 10 (FIG. 1A) also includes a plurality of through interconnects 32, and a plurality of terminal contacts 34 in electrical communication with the through interconnects 32. Each through interconnect 32 includes an insulated substrate opening 36 in the semiconductor substrate 12 aligned with an inner surface 44 of an associated substrate contact 26. Each through interconnect 32 also includes a projection 38 on a front side 50 of the interposer substrate 14 in mating physical engagement with an associated substrate opening 36. Each through interconnect 32 also includes at least one conductive via 40 in the projection 38 having a contact 42 configured for physical and electrical contact with an inner surface 44 of an associated substrate contact 26. In general, the projections 38 (FIG. 1C) are male elements and the substrate openings 36 (FIG. 1C) are female elements have mating sizes and shapes. In addition, the conductive vias 40 (FIG. 1C) provide separate electrical paths from the substrate contacts 26 (FIG. 1C) through the projections 38 (FIG. 1C) and the interposer substrate 14 (FIG. 1C) to the terminal contacts 34 (FIG. 1C).

As also shown in FIG. 1C, the semiconductor substrate 12 can also include an electrical insulation layer 46 on the back side 24 thereof extending into the substrate openings 36 of the through interconnects 32. The electrical insulation layer 46 can comprise a single layer of material or the substrate openings 36 can include different insulation layers. In addition, the interposer substrate 14 includes an electrical insulation layer 47 on a front side 50 thereof, an electrical insulation layer 48 on a backside 52 thereof, and a pattern of backside conductors 54 on the electrical insulation layer 48. As with the insulation layer 30 (FIG. 1C), the electrical insulation layers 46, 47 and 48 (FIG. 1C) can comprise an electrically insulating material, such as a glass (e.g., borophosphosilicate glass), a polymer (e.g., polyimide, polydimethylsiloxane (PMS)), or an oxide (e.g., $SiO_2$). For some applications, one or more of the electrical insulation layers 46, 47 and 48 can be omitted. The interposer substrate 14 also includes a plurality of terminal contact pads 56 (FIG. 1C) on the electrical insulation layer 48 in electrical communication with the backside conductors 54 (FIG. 1C) configured for mounting the terminal contacts 34 to the interposer substrate 14.

In the semiconductor component 10 (FIG. 1A), both the semiconductor substrate 12 (FIG. 1C) and the interposer substrate 14 (FIG. 1C) can comprise silicon, or another semiconductor material such as germanium or gallium arsenide. In addition, as will be further explained, the substrate openings 36 (FIG. 1C) in the semiconductor substrate 12 for the through interconnects 32 (FIG. 1C), and the projections 38 (FIG. 1C) in the interposer substrate 14 for the through interconnects 32 (FIG. 1C), can be formed with mating sizes and shapes using anisotropic etching processes. With an anisotropic etching process performed on the backside 24 (FIG. 1C) of the semiconductor substrate 12 (FIG. 1C), each substrate opening 36 (FIG. 1C) has an angle X° (FIG. 1C) measured between the sidewalls of the substrate openings 36 (FIG. 1C) and the circuit side 22 (FIG. 1C) of the semiconductor substrate 12 (FIG. 1C) of about 54.7°. Similarly, with an anisotropic etching process performed on the front side 50 (FIG. 1C) of the interposer substrate 14 (FIG. 1C), each projection 38 (FIG. 1C) has an angle X° (FIG. 1C) measured from the sidewalls of the projections 38 (FIG. 1C) and the front side 50 (FIG. 1C) of the interposer substrate 14 of about 54.7°. The X° angles of 54.7° are due to the different etch rates between the {110} and the {100} surfaces of silicon. Rather than using an anisotropic etch process to form the projections 38 (FIG. 1C) a dry etch process, such as a Bosch etch, can be used.

Figures 1D, 1E, 1F:
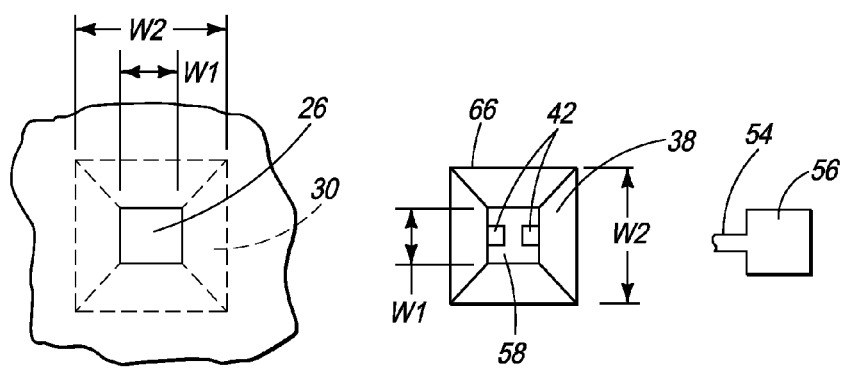
FIG. 1D is a schematic view taken along line 1D-1D of FIG. 1C illustrating a substrate opening of the through interconnect.
FIG. 1E is a schematic view taken along line 1E-1E of FIG. 1C illustrating a projection of the through interconnect.
FIG. 1F is a schematic cross sectional view taken along line 1F-1F of FIG. 1C illustrating a terminal contact pad of the semiconductor component.

As shown in FIG. 1D, an anisotropic etch process on the semiconductor substrate 12 can be performed such that each substrate opening 36 has a generally truncated conical or pyramidal shape recessed into the backside 24 of the semiconductor substrate 12, and terminating on the inner surface 44 (FIG. 1C) of an associated substrate contact 26. As shown in FIG. 1E, an anisotropic etch process on the interposer substrate 14 can be performed such that each projection 38 has a generally truncated conical or pyramidal shape projecting from the front side 50 of the interposer substrate 14. Further, both anisotropic etch processes can be performed such that a depth D (FIG. 1C) of each substrate opening 36 (FIG. 1C) is approximately equal to a height H (FIG. 1C) of each projection 38. As another alternative, the height H (FIG. 1C) of each projection 38 can be greater than the depth D (FIG. 1C) of each substrate opening 36 (FIG. 1C) such that a space is formed between the interposer substrate 14 (FIG. 1C) and the semiconductor substrate 12 (FIG. 1B). As will be further explained a polymer underfill material can be placed in the space. A representative range for the depth D and the height H can be from about 5 μm to 725 μm.

Still further, as shown in FIG. 1E, the upper surfaces 58 of the projections 38 can have a square peripheral shape, and a width W1 (FIG. 1E), which are approximately equal to, but slightly smaller than the square peripheral shape and the width W1 (FIG. 1D) of the substrate openings 36 (FIG. 1D) near the substrate contacts 26. In addition, the bases 66 (FIG. 1D) of the projections can also have a square peripheral shape, and a width W2 (FIG. 1E), which are approximately equal to, but slightly smaller than the square peripheral shape and the width W2 (FIG. 1D) of the substrate openings 36 near the back side 52 (FIG. 1C) of the semiconductor substrate 12. A representative range for the width W1 and the width W2 can be from about 5 μm to 200 μm.

The anisotropic etch processes can also be performed such that the substrate openings 36 (FIG. 1C) and the projections 38 (FIG. 1C) are almost the same size, but with the projections 38 slightly smaller to permit them to fit into the substrate openings 36. For some applications, the insulation layer 46 (FIG. 1C) in the substrate openings 36 (FIG. 1C) can be made of a compliant polymeric material, such as polyimide or parylene, to provide a press fit between the projections 38 (FIG. 1C) and the substrate openings 36 (FIG. 1C). In this case, the insulation layer 46 (FIG. 1C) can have a thickness of several microns or more, which is selected to permit some deformation, while still maintaining physical continuity for electrical insulation. As another alternative, the insulation layer 46 (FIG. 1C) in the substrate openings 36 (FIG. 1C) can comprise an adhesive material, such that the projections 38 (FIG. 1C) adhesively bond to the substrate openings 36 (FIG. 1C). As another alternative, a separate adhesive layer (not shown) can be deposited on the sidewalls of the substrate openings 36 (FIG. 1C), such that the projections 38 (FIG. 1C) adhesively bond to the substrate openings 36 (FIG. 1C).

As shown in FIG. 1C, each conductive via 40 extends completely through a projection 38 and through the interposer substrate 14, to the back side 52 of the interposer substrate 14. As also shown in FIG. 1C, each projection 38 can have multiple conductive vias (e.g., two). However, as shown in FIG. 1B, some of the projections 38 have only one conductive via 40. In general, depending on space limitations, and the number of electrical paths required by a through interconnect 32 (FIG. 1C), each projection 38 can have from one to five conductive vias 40. In addition, the conductive vias 40 (FIG. 1C) can comprise an electrically conductive metal, or a conductive polymer, deposited in an electrically insulated via of a selected diameter.

Each conductive via 40 (FIG. 1C) can also include a contact 42 (FIG. 1C) configured for physical and electrical contact with the inner surface 44 (FIG. 1C) of an associated substrate contact 26 (FIG. 1C). The contacts 42 (FIG. 1C) on the conductive vias 40 (FIG. 1C) can comprise pads or bumps formed on the top surfaces 58 (FIG. 1E) of the projections 38 (FIG. 1E), or alternately can comprise the upper planar surfaces of the conductive vias 40. In addition, the contacts 42 (FIG. 1C) can comprise a metal, a solder, or a conductive polymer, that bonds easily to the inner surfaces 44 (FIG. 1C) of the substrate contacts 26 (FIG. 1C) using a process such as soldering, diffusion, heat, pressure, ultrasound, or curing. For example, for substrate contacts 26 (FIG. 1C) which comprise aluminum, the contacts 42 of the conductive vias 40 can comprise gold, copper, nickel or palladium, metals which bond easily to aluminum. As another alternative, the contacts 42 can comprise a layer of a conductive polymer, such as a metal filled silicone, or a z-axis epoxy. Suitable conductive polymers are available from A.I. Technology, Trenton, N.J.; Sheldahl, Northfield, Minn.; and 3M, St. Paul, Minn. Another suitable conductive polymer is a nano-particle paste or ink, having metal nano-particles made of a highly conductive metal, such as gold or silver. Nano-particle conductive polymers are commercially available from Superior Micropowders, of Albuquerque, N. Mex.

As shown in FIG. 1F, the backside conductors 54 and the terminal contact pads 56 can comprise a same patterned layer of material, such as a highly conductive metal layer (e.g., Cu, Al, Au). The terminal contacts 34 (FIG. 1C) can comprise metal balls, solder balls, bumps, pins, stud bumps, or insulated wire stud bumps formed on the terminal contact pads 56 using a metallization process, a stud bumping process or a ball bonding process. A representative range for the diameter of the terminal contacts 34 (FIG. 1C) can be from 60-500 µm. In addition, the terminal contact pads 56 and the terminal contacts 34, can be formed in an area array, such as a ball grid array, a pin grid array, an edge array or a center array.

Figure 2A:
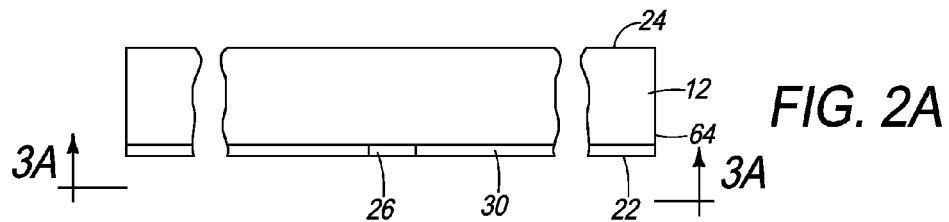
FIGS. 2A-2D are schematic cross sectional views illustrating steps in a method for fabricating a semiconductor substrate of the semiconductor component of FIG. 1A.
Figure 2B:
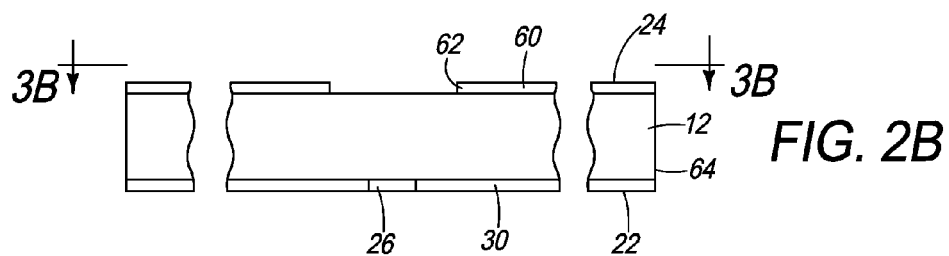
Figure 2C:
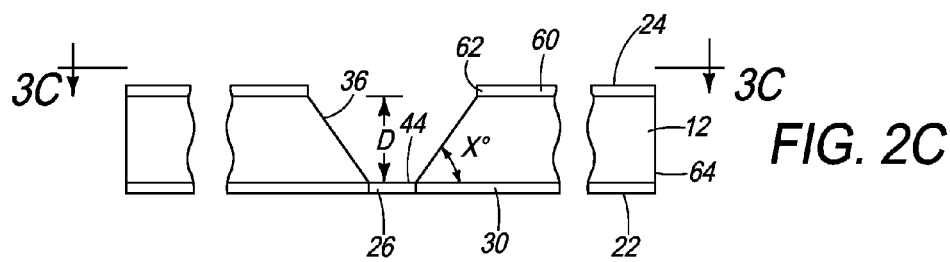
Figure 2D:
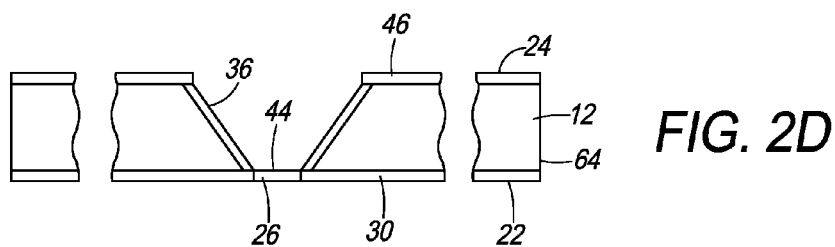
Figure 3A:
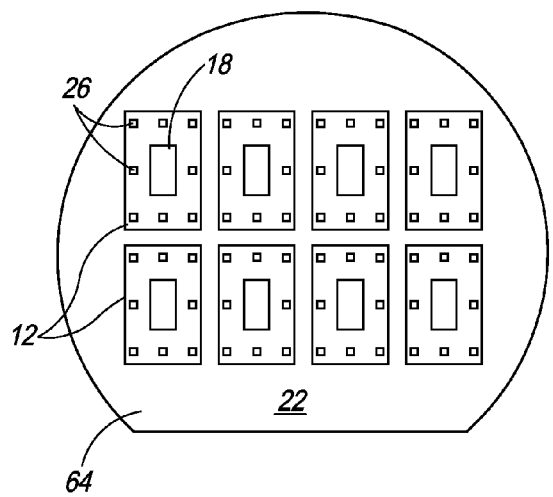
FIG. 3A is a view taken along line 3A-3A of FIG. 2A illustrating a semiconductor wafer containing multiple semiconductor substrates having substrate contacts.

Referring to FIGS. 2A-2D and 3A-3C, steps in a method for fabricating the semiconductor substrate 12 of the semiconductor component 10 (FIG. 1A) are illustrated. In FIGS. 2A-2D and 3A-3C, a wafer level fabrication process is illustrated. However, it is to be understood that the method can also be performed at the die level on individual semiconductor substrates 12. Initially, as shown in FIGS. 2A and 3A, a plurality of the semiconductor substrates 12 are provided on a semiconductor wafer 64. In addition, the semiconductor substrates 12 can be provided with the substrate contacts 26 in electrical communication with the integrated circuits 20 (FIG. 1C) and with the pixel arrays 18 (FIG. 3A). Further, the semiconductor substrates 12 can be provided with the insulation layers 30 on the circuit sides 22, and with the substrate contacts 26 embedded in the insulation layers 30. The substrate contacts 26, the integrated circuits 20, the pixel arrays 18, and the insulation layers 30 can be fabricated using well known semiconductor fabrication techniques. The semiconductor substrate 12 can also be thinned from the backside 24 using a suitable process such as grinding, chemical mechanical planarization (CMP) or etching. A representative thickness of the semiconductor substrate 12 can be from 10 µm to 725 µm.

Figure 3B:
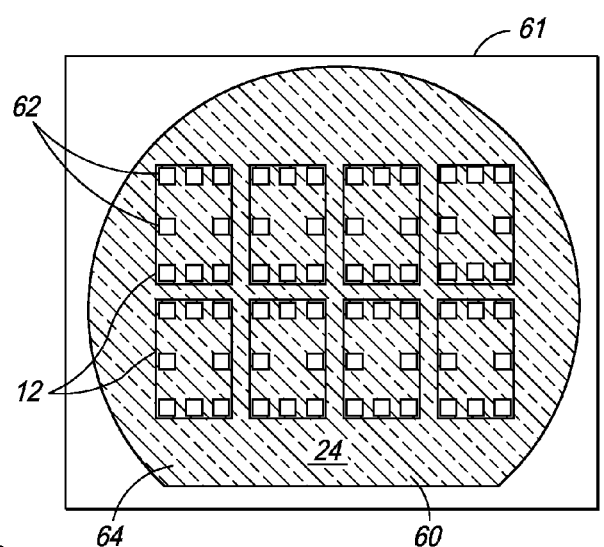
FIG. 3B is a view taken along line 3B-3B of FIG. 2B illustrating an etch mask on a back side the semiconductor wafer.
Figure 3C:
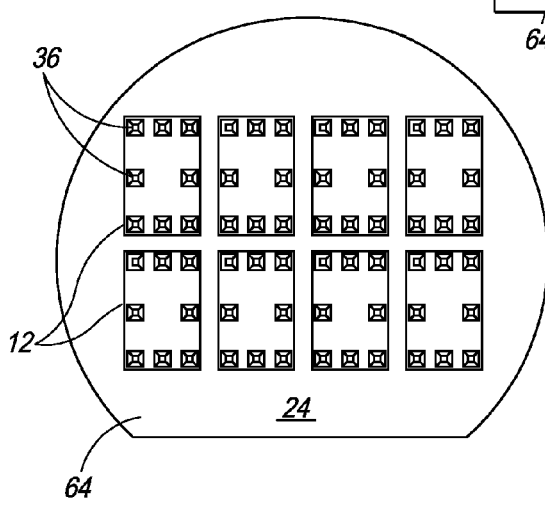
FIG. 3C is a view taken along line 3C-3C of FIG. 2C illustrating openings in the back sides of the semiconductor substrate aligned with the substrate contacts.

Next, as shown in FIGS. 2B and 3B, a mask 60 having mask openings 62 can be formed on the backside 24 of the wafer 64, and an opening forming step can be performed. During the opening forming step, the substrate openings 36 (FIG. 2C) are formed through the semiconductor substrates 12 to the substrate contacts 26. In addition, the opening forming step can be performed such that the substrate contacts 26 maintain their electrical communication with the internal conductors 28 (FIG. 1C), and with the integrated circuits 20 (FIG. 1C) in the semiconductor substrates 12.

The mask 60 (FIG. 2B) can comprise a material such as silicon nitride (i.e., hard mask) or resist, deposited to a desired thickness, and then patterned with the mask openings 62 (FIG. 2B), using a suitable process. For example, the mask 60 (FIG. 2B) can be formed using photo patterning equipment configured to form the mask openings 62 (FIG. 2B) with a required size and shape, and in precise alignment with the substrate contacts 26. During formation of the mask 60 (FIG. 2B), and also during thinning as previously described, the wafer 64 (FIG. 3C) can be held in a temporary carrier 61 (FIG. 3B). For example, temporary carriers made of glass can be fused by heat and adhesives to the wafer 64 (FIG. 3C) to protect the circuit sides 22 of the semiconductor substrates 12 and permit backside processes such etching, grinding and chemical mechanical planarization (CMP) to be performed. Suitable, temporary carriers are manufactured by 3-M Corporation of St. Paul, Minn., and others as well. Because the steps of the method are performed primarily from the backside 24 of the wafer 64, the circuit side 22 can remain face down and protected by the temporary carrier 61 (FIG. 3B). As another alternative, for some steps of the method, the circuit sides 22 of the semiconductor substrates 12 can be protected by a removable material such as a tape or mask material applied to the wafer 64.

The opening forming step can be performed using an anisotropic wet etching process. For example, with the wafer 64 (FIG. 2B) and the substrates 12 (FIG. 2B) comprising silicon, one suitable wet etchant comprises a solution of KOH and $H_2O$. With a KOH etchant, an anisotropic etch process is performed, and the substrate openings 36 (FIG. 2C) are conical or pyramidal shaped, with sloped sidewalls oriented at an angle of about 54.7° with the respect to the planes of the backsides 24 of the semiconductor substrates 12. In FIG. 2C, the substrate openings 36 are illustrated with sloped sidewalls, such as would occur with an anisotropic etch process. Further, the thickness of the semiconductor wafer 64 is selected, and the anisotropic etch process is controlled, to form the substrate openings 36 with a selected depth D, which will substantially match the height H (FIG. 1C) of the projections 38 (FIG. 1C).

As shown in FIGS. 2B and 2C, the opening forming step is performed from the backsides 24 of the semiconductor substrates 12, such that the circuit sides 22 can remain protected. In addition, the opening forming step can be performed with the wafer 64 held in the temporary carrier 61 (FIG. 3B). Further, the opening forming step can be controlled to endpoint the substrate openings 36 (FIG. 2C) on the inner surfaces 44 (FIG. 2C) of the substrate contacts 26 (FIG. 2C). As another alternative, the opening forming step can be endpointed with the insulation layer 22 covering the inner surfaces 44 (FIG. 2C) of the substrate contacts 26 (FIG. 2C), which can then be removed by a process such as a chemical etch. For example, if the insulation layer 22 comprises a die passivation layer (e.g., BPSG or $SiO_2$), and the substrate contacts 26 (FIG. 2C) comprise the device bond pads, then the substrate contacts 26 (FIG. 2C) may in effect be embedded in the insulation layer 22, which can be removed from the inner surface 44 after the opening 36 has been formed. The inner surfaces 44 (FIG. 2D) of the substrate contacts 26 (FIG. 2D) can also be coated with a metal such as solder, nickel or gold, or alternately with a conductive polymer, to facilitate bonding to the contacts 42 (FIG. 4D) on the projections 38 (FIG. 4D). In this case, a suitable deposition process such as CVD, screen printing or ink jet deposition can be used to coat the inner surfaces 44 (FIG. 2D) of the substrate contacts 26 (FIG. 2D).

For simplicity in FIGS. 2C-2D, the substrate openings 36 are illustrated as having about the same width W1 at their intersections with the substrate contacts 26, as the width W of the substrate contacts 26. However, if desired, the substrate openings 36 can be smaller or larger in width W1 than the width W of the substrate contacts 26. In any case, the substrate openings 36 are preferably formed with a profile that matches the profile of the projections 38 (FIG. 1C). In addition, the substrate openings 36 are formed such that the electrical connections between the substrate contacts 26 and the internal conductors 28 (FIG. 1C) are maintained.

Next, as shown in FIG. 2D, the mask 60 can be removed from the backside 24 of the wafer 64, and insulation layers 46 can be formed on the backsides 24 of the semiconductor substrates 12 and in the substrate openings 36. As another alternative the mask 60 can be left on the backside 24 of the wafer 64 as a protective or insulating layer. The insulation layers 46 can comprise a polymer, such as polyimide or parylene, deposited using a suitable process, such as vapor deposition, capillary injection or screen-printing. Alternately, the insulation layers 46 can comprise a deposited oxide layer, such as a low temperature deposited oxide. As another alternative, the insulation layers 46 can comprise a grown oxide layer, such as silicon dioxide formed by oxidation of silicon.

Figure 4A:
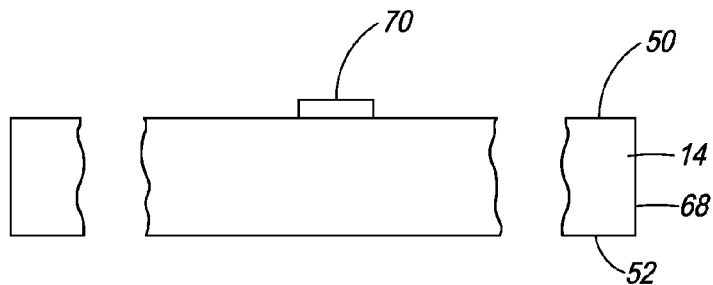
FIGS. 4A-4D are schematic cross sectional views illustrating steps in a method for fabricating an interposer substrate of the semiconductor component of FIG. 1A.
Figure 4B:
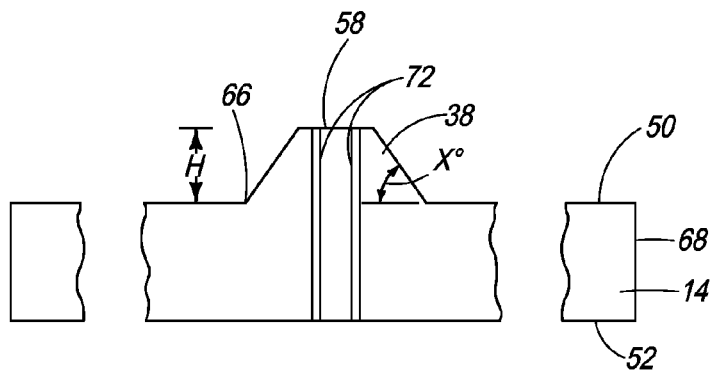
Figure 4C:
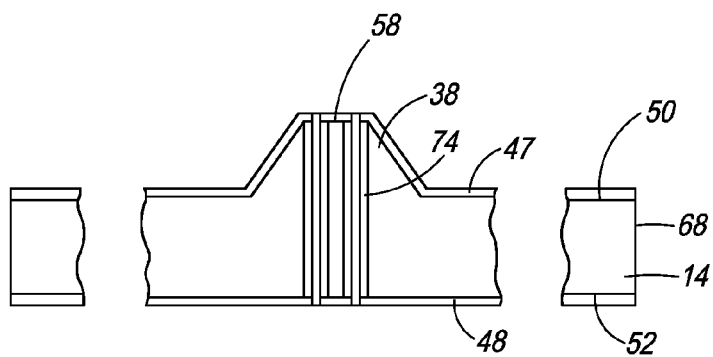
Figure 4D:
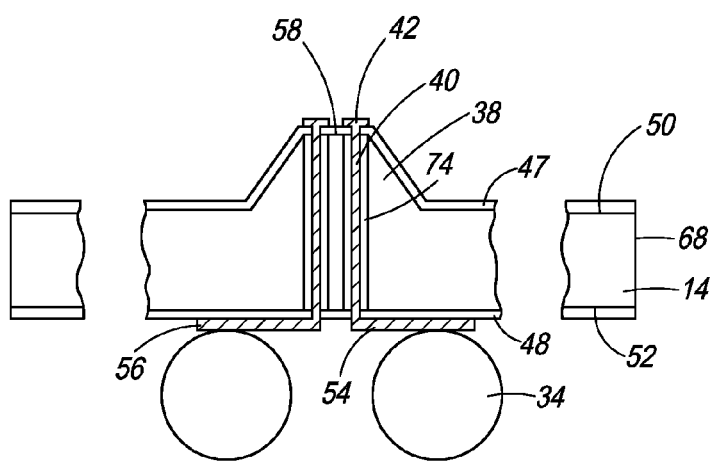

Referring to FIGS. 4A-4D, steps in a method for fabricating the interposer substrate 14 of the semiconductor component 10 (FIG. 1A) are illustrated. In FIGS. 4A-4D, a wafer level fabrication process is illustrated. However, it is to be understood that the method can also be performed at the die level on individual interposer substrates 14. Initially, as shown in FIG. 4A, a plurality of the interposer substrates 14 are provided on a semiconductor wafer 68. In this case, the semiconductor wafer 68 can comprise a blank silicon wafer containing no active semiconductor devices. In addition, initially the interposer substrates 14 are just undefined areas on the semiconductor wafer 68. Further, at some point in the process illustrated in FIGS. 4A-4D, the wafer 68 can be thinned from the backside using a process such as grinding, chemical mechanical planarization (CMP) or etching to a desired thickness. During backside thinning and other steps of the method as well, the wafer 68 can be held in a temporary carrier (e.g., carrier 61—FIG. 3B). A representative thickness of the semiconductor wafer 68 can be from 10 µm to 725 µm. As also shown in FIG. 4A, an etch mask 70 is formed on the front side 50 of the semiconductor wafer 68, substantially as previously described for etch mask 60 (FIG. 2B). However, the etch mask 60 has solid areas on the semiconductor wafer 68, which correspond to the locations of the projections 38 (FIG. 4B). In addition, the solid areas of the etch mask 60 have a size which corresponds to the top surfaces 58 (FIG. 4B) of the projections 38 (FIG. 4B).

Next, as shown in FIG. 4B, an anisotropic etch process can be performed substantially as previously described, to etch the projections 38 on the front side 50 of the wafer 68. With an anisotropic etch process the projections 38 are conical or pyramidal shaped, with sloped sidewalls oriented at an angle of about 54.7° with the respect to the plane of the backsides 52 of the interposer substrates 14. In FIG. 4B, the projections 38 are illustrated with sloped sidewalls, such as would occur with an anisotropic etch process. Further, the thickness of the semiconductor wafer 68 is selected, and the anisotropic etch process is controlled, to form the projections with a selected height H, which will substantially match the depth D (FIG. 1C) of the openings 36 (FIG. 1C).

Next, as shown in FIG. 4C, vias 72 for the conductive vias 40 (FIG. 4D) are formed through the projections 38 to the back sides of the interposer substrates 14. The vias 72 can be formed using a wet or dry etching process. By way of example, the diameters of the vias 72 can be from 10 µm to 2 mils or greater. Another method for forming the vias 72 uses laser machining followed by etching. In this case the vias 72 will have a generally tapered profile which decreases in a direction farthest from the entry point of the laser. A suitable laser system for performing the laser machining step is manufactured by Electro Scientific, Inc., of Portland, Oreg. and is designated a Model No. 2700. Another laser system is manufactured by XSIL Corporation of Dublin, Ireland and is designated a Model No. "XCISE-200". A representative laser fluence for forming the vias 72 through a silicon substrate having a thickness of about 28 mils (725 µm), is from 2 to 10 watts/per opening at a pulse duration of 20-25 ns, and at a repetition rate of up to several thousand per second. The wavelength of the laser beam can be a standard UV wavelength (e.g., 355 nm).

Next, as shown in FIG. 4C, the insulation layers 47, 48 can be formed substantially as previously described for the insulation layers 46 (FIG. 2D). The insulation layers 47, 48 can comprise a polymer, such as polyimide or parylene, deposited using a suitable process, such as injection, vapor deposition, capillary wetting, molding, jetting or screen-printing. Alternately, the insulation layers 47, 48 can comprise a deposited oxide layer, such as a low temperature deposited oxide. As another alternative, the insulation layers 47, 48 can comprise a grown oxide layer, such as silicon dioxide formed by oxidation of silicon. As also shown in FIG. 4C, the insulation layers 74 can also be formed on the inside diameters of the vias 72 to electrically insulates the vias 72. Like the insulation layers 47, 48, the insulation layers 74 in the vias 72 can comprise an electrically insulating material, such as a polymer (e.g., polyimide or parylene) or an oxide (e.g., $SiO_2$). All of the insulation layers 47, 48, 74 are formed such that the vias 72 remain open. As another alternative the insulation layers in the vias 72 can be formed separately and the vias 72 reopened as required using an etching or laser machining process.

Next, as shown in FIG. 4D, the vias 72 are at least partially filled with a conductive material to form the conductive vias 40. The conductive vias 40 can be plugs that completely fill the vias 72, or alternately, can be layers that cover just the inside surfaces or sidewalls of the vias 72. In addition, the contacts 42 for the conductive vias 40 can comprise a same conductive material, or alternately a different conductive material. For example, the conductive material can comprise a highly conductive metal, such as aluminum, titanium, nickel, iridium, copper, gold, tungsten, silver, platinum, palladium, tantalum, molybdenum, tin, zinc and alloys of these metals including solder alloys. The above metals can be deposited within the vias 72 using a deposition process, such as electroless deposition, CVD, or electrolytic deposition.

Rather than being a metal, the conductive material can comprise a conductive polymer, such as a metal filled silicone, or an isotropic epoxy. A conductive polymer can be deposited within the vias 72, as a viscous material, and then cured as required. A suitable deposition process, such as screen printing, stenciling, or ink jet deposition can be used to deposit the conductive polymer into the vias 72. Suitable conductive polymers are available from A.I. Technology, Trenton, N.J.; Sheldahl, Northfield, Minn.; and 3M, St. Paul, Minn. Another suitable conductive polymer is a nano-particle paste or ink, having metal nano-particles made of a highly conductive metal, such as gold or silver. Nano-particle conductive polymers are commercially available from Superior Micropowders, of Albuquerque, N. Mex.

Next, as shown in FIG. 4D, the back side conductors 54 and the terminal contact pads 56 can be formed on the back side 52 of the wafer 68, using a suitable process such as a metallization process (e.g., etching or deposition through a mask). In addition, the terminal contacts 34 can be formed on the terminal contact pads 56 using a suitable process. For example, the terminal contacts 34 can comprise metal, or solder balls, bumps or pins, formed on the terminal contact pads 56 using a metallization process, a stud bumping process or a ball bonding process.

Following completion of the interposer substrates 14 (FIG. 4D) on the semiconductor wafer 68 (FIG. 4D), and the completion of the semiconductor substrates 12 (FIG. 2D) on the semiconductor wafer 64 (FIG. 2D), an aligning and placing step can be performed. During the aligning and placing step the wafers 64, 68 are aligned, and the projections 38 (FIG. 4D) on the interposer substrates 14 (FIG. 4D) are placed in the openings 36 (FIG. 2D) on the semiconductor substrates 12 (FIG. 2D). In addition, the contacts 42 (FIG. 4D) on the projections 38 (FIG. 4D) are placed in physical contact with the inner surfaces 44 (FIG. 2D) of the substrate contacts 26 (FIG. 2D). The aligning and placing step can be performed using a suitable tool such as an aligner bonder tool available from a manufacturer such as Karl Suss or EVG. In addition, during the aligning and placing step, one or both of the wafers 64, 68 can be held using temporary carrier (e.g., carrier 61—FIG. 3B).

Following the aligning and placing step, a bonding step can optionally be performed to bond the contacts 42 (FIG. 2D) on the projections 38 (FIG. 4D) to the inner surfaces 44 (FIG. 2D) of the substrate contacts 26 (FIG. 2D). Depending on the material of the contacts 42 (FIG. 2D) the bonding step can be performed using heat, pressure, ultrasonic vibrations, or by depositing and curing a conductive adhesive material. For example, the contacts 42 (FIG. 2D) can comprise a metal such as gold or solder that is heated to metallurgically bond to the substrate contacts 26 (FIG. 2D) made of aluminum. As another example, a cold weld such as a gold to gold diffusion bond can be formed. As another example, ultrasonic energy can be used to bond metal layers. As another alternative, the contacts 42 (FIG. 4D) can comprise a conductive polymer that is deposited in viscous form using a process such as ink jet deposition, and then cured in contact with the substrate contacts 26 (FIG. 2D). As another alternative, the inner surfaces 44 (FIG. 2D) of the substrate contacts 26 (FIG. 2D) can be coated with a metal such as solder, nickel or gold to facilitate bonding to the contacts 42 (FIG. 4D) on the projections 38 (FIG. 4D). As another alternative the projections 38 (FIG. 4D) in the interposer substrate 14 can be sized relative to the openings 36 (FIG. 2D) in the semiconductor substrate 12 such that a gap is formed which can be filled with a polymer underfill material which also adhesively bonds the interposer substrate 14 and the semiconductor substrate 12.

Following the bonding step, a singulating step can be performed in which the bonded wafers 64 (FIG. 2D) and 68 (FIG. 4D) and the bonded substrates 12 (FIG. 2D), 14 (FIG. 4D) are singulated into individual components 10 (FIG. 1A). The singulating step can be performed using a dicing saw configured to dice semiconductor wafers into individual dice. Alternately rather than by sawing, the singulating step can be performed using another singulation method, such as cutting with a laser or a water jet, or by etching with a suitable wet or dry etchant. Either prior to, or alternately after the singulating step, the transparent substrate 16 can be attached to the semiconductor substrate 12 using techniques that are known in the art.

Figure 5A:
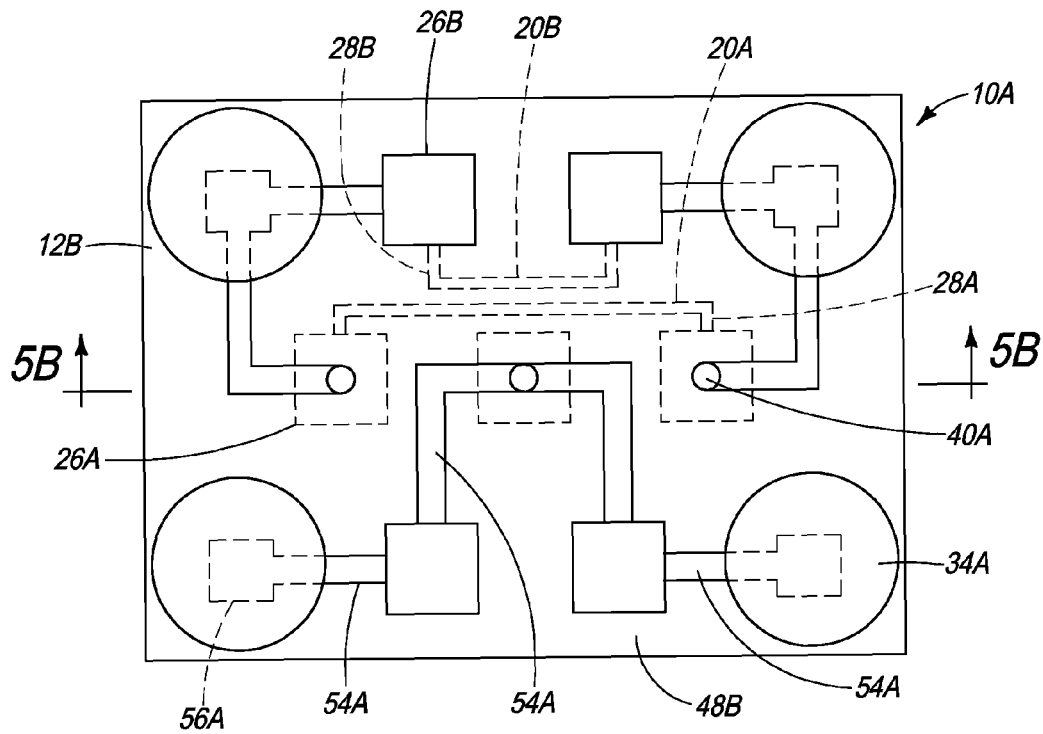
FIG. 5A is a schematic bottom view of a stacked die semiconductor component having through interconnects.
Figure 5B:
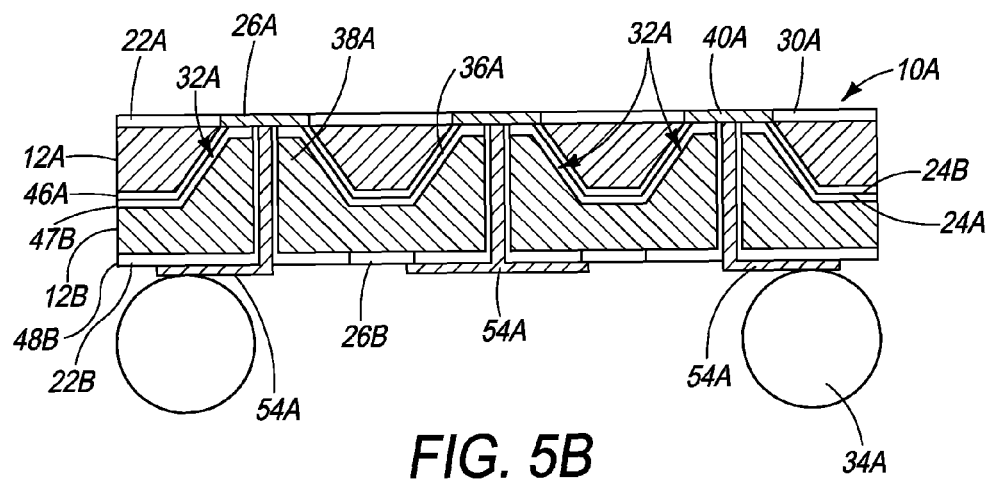
FIG. 5B is a schematic cross sectional view of the stacked die semiconductor component taken along section line 5B-5B of FIG. 5A.

Referring to FIGS. 5A-5B, a stacked die semiconductor component 10A is illustrated. The stacked die semiconductor component 10A includes a first semiconductor substrate 12A (FIG. 5B), and a second semiconductor substrate 12B (FIG. 5B). The stacked die semiconductor component 10A is substantially similar to the semiconductor component 10 (FIG. 1A) but with the interposer substrate 14 (FIG. 1B) replaced by the second semiconductor substrate 12B (FIG. 5B). In addition, the first semiconductor substrate 12A (FIG. 5B) includes integrated circuits 20A (FIG. 5B), and the second semiconductor substrate 12B (FIG. 5B) also includes integrated circuits 20B (FIG. 5A). Further, the first semiconductor substrate 12A (FIG. 5B) and the second semiconductor substrate 12B (FIG. 5B) are stacked backside 24A to backside 24B with their circuits sides 22A, 22B forming the outsides of the stacked die semiconductor component 10A. Still further, electrical insulation layers 30A, 46A, 47B, 48B insulate the major planar surfaces of the first semiconductor substrate 12A (FIG. 5B) and the second semiconductor substrate 12B (FIG. 5B).

For some applications, such as in the construction of a system in a package, the first semiconductor substrate 12A and the second semiconductor substrate 12B can have different electrical configurations. For example, the first semiconductor substrate 12A can comprise a memory device (e.g., DRAM), and the second semiconductor substrate 12B can comprise a processor or an application specific integrated circuit (ASIC). In general, both the first semiconductor substrate 12A and the second semiconductor substrate 12B can comprise a selected high speed digital logic device selected from the group consisting of a dynamic random access memory (DRAM), a static random access memory (SRAM), a flash memory, a microprocessor, a digital signal processor (DSP), an application specific integrated circuit (ASIC), or a MEMS type device. Further, both the first semiconductor substrate 12A and the second semiconductor substrate 12B can comprise known good dice (KGD). Still further, both the first semiconductor substrate 12A and the second semiconductor substrate 12B can have a desired thickness, and can comprise thinned dice as previously described. Also, the first semiconductor substrate 12A can be made very thin because it is protected and rigidified by the second semiconductor substrate 12B. A representative thickness for the first semiconductor substrate 12A and the second semiconductor substrate 12B can be from 10 μm to 725 μm.

As shown in FIG. 5B, the first semiconductor substrate 12A (FIG. 5B) also includes a plurality of substrate contacts 26A on its circuit side 22A. The substrate contacts 26A (FIG. 5B) can comprise the device bond pads, or redistribution (rdl) contacts, in electrical communication with the internal conductors 28A (FIG. 5A) and the integrated circuits 20A (FIG. 5A) on the first semiconductor substrate 12A. The stacked die semiconductor component 10A also includes through interconnects 32A in electrical communication with the backsides of the substrate contacts 26A on the first semiconductor substrate 12A, substantially as previously described for through interconnects 32 (FIG. 1C).

Each through interconnect 32A (FIG. 5B) includes an insulated substrate opening 36A (FIG. 5B) in the semiconductor substrate 12A aligned with the backside of an associated substrate contact 26A (FIG. 5B). Each through interconnect 32A also includes a projection 38A (FIG. 5B) on a back side 24B (FIG. 5B) of the second semiconductor substrate 12B (FIG. 5B) configured for mating physical engagement with an associated substrate opening 36A (FIG. 5B) in the first semiconductor substrate 12A (FIG. 5B). Each through interconnect 32A (FIG. 5B) also includes at least one conductive via 40A (FIG. 5B) in the projection 38A having a contact configured for physical and electrical contact with a backside of an associated substrate contact 26A (FIG. 5B).

As shown in FIG. 5A, the second semiconductor substrate 12B also includes a plurality of substrate contacts 26B on its circuit side 22B (FIG. 5B). The substrate contacts 26B (FIG. 5A) can comprise the device bond pads, or redistribution (rdl) contacts, in electrical communication with the internal conductors 28B (FIG. 5A) and the integrated circuits 20B (FIG. 5A) on the second semiconductor substrate 12B. The second semiconductor substrate 12B (FIG. 5A) also includes conductors 54A (FIG. 5A), terminal contact pads 56A (FIG. 5A) and terminal contacts 34A (FIG. 5A) on the circuit side 22B thereof. With this arrangement, the conductors 54A (FIG. 5A) electrically connect the terminal contacts 34A (FIG. 5A) to the conductive vias 40A (FIG. 5A) of the through interconnects 32A (FIG. 5B), and to the substrate contacts 26B on the second semiconductor substrate 12B (FIG. 5A) as well.

The stacked die semiconductor component 10A can be fabricated using a wafer level process, or a die level fabrication process, substantially as previously described for semiconductor component 10 (FIG. 1B). In addition, the first semiconductor substrate 12A (FIG. 5B) can be fabricated substantially as previously described and shown in FIGS.

2A-2D for the semiconductor substrate 12 (FIG. 1B). The second semiconductor substrate 12B (FIG. 5B) can be fabricated substantially as previously described and shown in FIGS. 4A-4D for the interposer substrate 14 (FIG. 1B). If desired, an additional insulation layer (not shown) can be formed on the circuit side 22A (FIG. 5B) of the first semiconductor substrate 12A (FIG. 5B). In addition, for stacking applications, stacking contacts (not shown) can be formed on the substrate contacts 26A (FIG. 5B) of the first semiconductor substrate 12A (FIG. 5B). As another alternative the terminal contacts 34A (FIG. 5B) can be formed on the substrate contacts 26A on the circuit side 22A of the first semiconductor substrate 12A.

Figure 6:
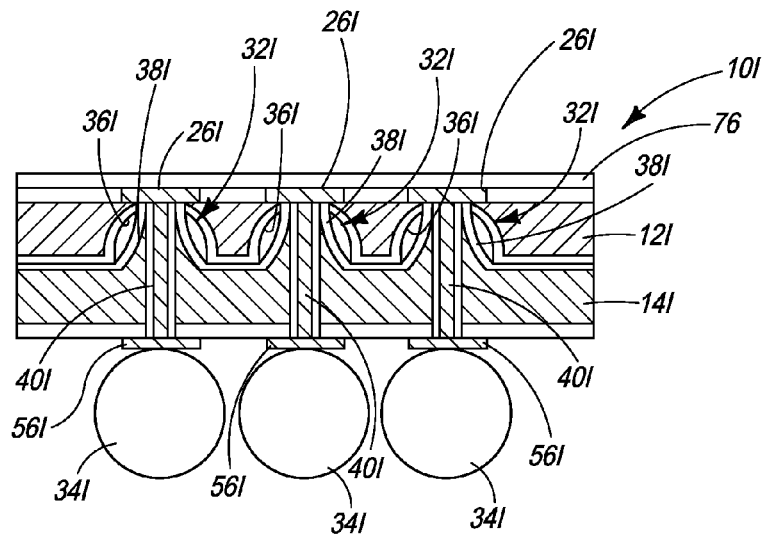
FIG. 6 is a schematic cross sectional view of a semiconductor component having through interconnects.

Referring to FIG. 6, a semiconductor component 10I having isotropic through interconnects 32I is illustrated. The semiconductor component 10I includes a semiconductor substrate 12I having substrate contacts 26I in electrical communication with integrated circuits substantially as previously described for substrate 12 (FIG. 1A). The semiconductor component 10I also includes an interposer substrate 14I having terminal contact pads 56I and terminal contacts 34I, substantially as previously described for interposer substrate 14 (FIG. 1B). The semiconductor component 10I also includes an encapsulant 76 on the circuit side of the semiconductor substrate 12I, which encapsulates the substrate contacts 26I.

The semiconductor component 10I (FIG. 6) also includes a plurality of through interconnects 32I, which are substantially similar to the previously described through interconnects 32 (FIG. 1B). However, in this case, the through interconnects 32I include substrate openings 36I that are isotropically etched in the semiconductor substrate 12I. With an isotropic etch process, the substrate openings 36I, rather than being conical or pyramidally shaped, are generally hemispherical or concave in shape. In addition, the through interconnects 32I include projections 38I that are isotropically etched on the interposer substrate 14I. With an isotropic etch process, the projections 38I, rather than being conical or pyramidally shaped, are generally radiused or convex in shape.

As with the anisotropic projections 38 (FIG. 1C) and the anisotropic substrate openings 36 (FIG. 1C), the isotropic projections 38I (FIG. 6) and the isotropic substrate openings 36I (FIG. 6) are configured for mating physical engagement. However, in this case, since the substrate openings 36I (FIG. 6) are generally hemispherical or concave, and the projections 38I (FIG. 6) are generally radiused or convex in shape, the projections 38I (FIG. 6) do not fit precisely into the substrate openings 36I (FIG. 6). In addition, there may be a space between the projections 38I (FIG. 6) and the substrate openings 36I (FIG. 6). The through interconnects 32I (FIG. 6) also include conductive vias 40I (FIG. 6) through the projections 38I (FIG. 6), that are in electrical contact with the substrate contacts 26I (FIG. 6) on the circuit side of the semiconductor substrate 12I (FIG. 6), and with the terminal contact pads 56I (FIG. 6) on the back side of the interposer substrate 14I (FIG. 6).

The semiconductor substrate 12I (FIG. 6) can be fabricated substantially as shown and described in FIGS. 2A-2D for semiconductor substrate 12 (FIG. 2D). The interposer substrate 14I (FIG. 6) can be fabricated substantially as shown and described in FIGS. 4A-4D for interposer substrate 14 (FIG. 4D). However, an isotropic etch process can be used to form the substrate openings 36I (FIG. 6), and an isotropic etch process can be used to form the projections 38I (FIG. 6). With the semiconductor substrate 12I (FIG. 6) and the interposer substrate 14I (FIG. 6) comprising silicon, one suitable etchant for performing isotropic etch processes is a solution of HF, $HNO_3$ and $H_2O$.

Figure 7:
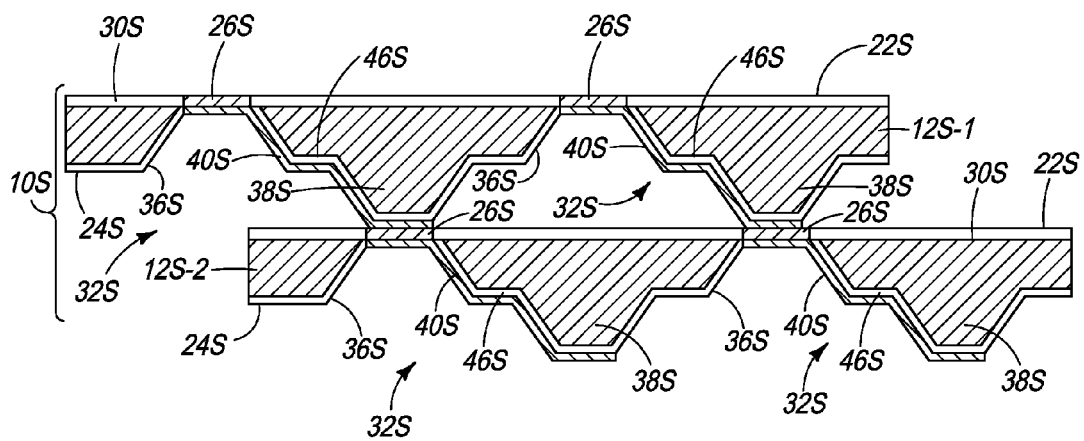
FIG. 7 is a schematic cross sectional view of a stacked semiconductor component having through interconnects.

Referring to FIG. 7, a multiple die stack semiconductor component 10S is illustrated. The multiple die stack semiconductor component 10S includes a first semiconductor substrate 12S-1, and a second semiconductor substrate 12S-2, which are substantially identical in construction. However, the semiconductor component 10S can include any number of stacked semiconductor substrates (e.g., 2 to 20). The semiconductor substrates 12S-1, 12S-2 (FIG. 7) include substrate contacts 26S on their circuit sides 22S (FIG. 7) in electrical communication with the integrated circuits contained in the semiconductor substrates 12S-1, 12S-2. The semiconductor substrates 12S-1, 12S-2 (FIG. 7) also include electrical insulation layers 30S (FIG. 7) on their circuit sides 22S (FIG. 7), and electrical insulation layers 46S (FIG. 7) on their back sides 24S (FIG. 7). The semiconductor substrates 12S-1, 12S-2 (FIG. 7) also include through interconnects 32S (FIG. 7), which comprise insulated substrate openings 36S (FIG. 7), projections 38S (FIG. 7) and conductive vias 40S (FIG. 7). However, in this case each semiconductor substrate 12S-1, 12S-2 includes both insulated substrate openings 36S and projections 38S. In addition, the conductive vias 40S can comprise metal layers, which extend between the insulated substrate openings 36S and the projections 38S, and at least partially cover the tip portions of the projections 38S. Further, the conductive vias 40S make contact with the backsides of the substrate contacts 26S, and cover the tips of the projections 38S. The semiconductor component 10S can be rigidified by filling the substrate openings 36S (FIG. 7) with a polymer material such as an underfill polymer.

As shown in FIG. 7, the semiconductor substrates 12S-1, 12S-2 are stacked circuit side 22S to back side 24S, such that the substrate contacts 26S on the second semiconductor substrate 12S-2 physically and electrically contact the projections 38S on the first semiconductor substrate 12S-1. In addition, the substrate contacts 26S on the second semiconductor substrate 12S-2 can be bonded to the conductive vias 40S on the first semiconductor substrate 12S-1, substantially as previously described for the contacts 42 (FIG. 1C) on the conductive vias 40 (FIG. 1C). In addition, following the stacking process, the openings 36S (FIG. 7) between adjacent semiconductor substrates 12S-1, 12S-2 can be filled with a polymer material such as silicone, polyimide or an underfill polymer.

Although the semiconductor substrates 12S-1, 12S-2 (FIG. 7) have an offset or staggered configuration, alignment can be achieved by redistributing the substrate contacts 26S on one of the semiconductor substrates 12S-1, 12S-2. The openings 36S (FIG. 7) in the semiconductor substrates 12S-1, 12S-2 can be fabricated using an anisotropic etch process, substantially as previously described for the openings 36 (FIG. 1C) in the semiconductor substrate 12 (FIG. 1C). The projections 38S (FIG. 7) on the semiconductor substrates 12S-1, 12S-2 can also be fabricated using an anisotropic etch process, substantially as previously described for the projections 38 (FIG. 1C) in the interposer substrate 14 (FIG. 1C). In this case, two etch processes can be performed on the same substrate using two separate etch masks. In addition, the conductive vias 40S can be fabricated using a suitable metallization process (e.g., deposition through a mask).

The semiconductor component 10S (FIG. 7) can be constructed with the semiconductor substrates 12S-1, 12S-2 having different electrical configurations, such that a system in a package can be provided. For example, some of the semiconductor substrates in a stack can comprise memory devices, and some of the semiconductor substrates in the stack can comprise processing devices or application specific devices.

Figure 9:
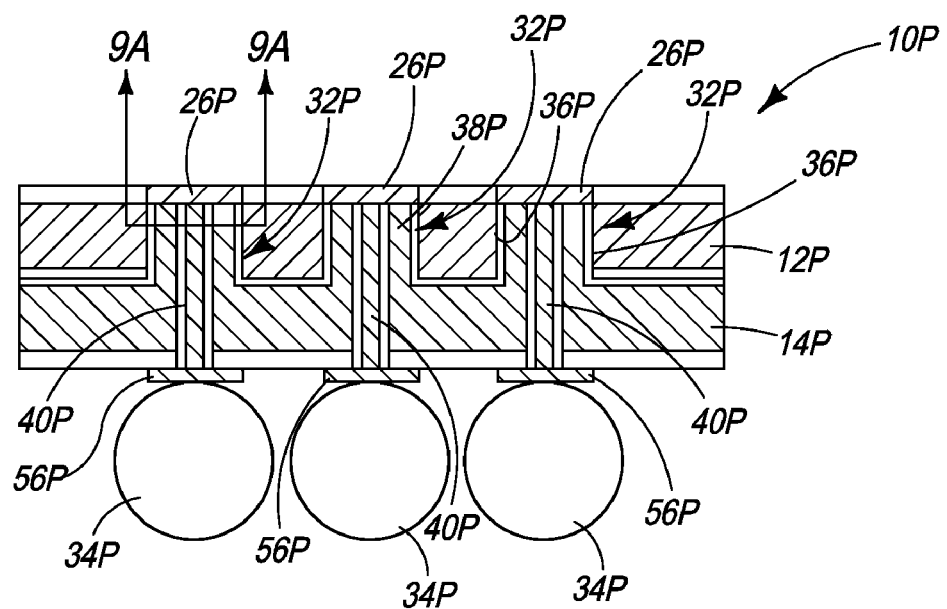
FIG. 9 is a schematic cross sectional view of a semiconductor component having through interconnects.
Figure 9A:
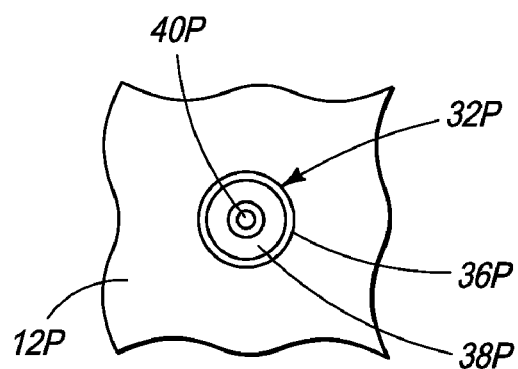
FIG. 9A is a schematic cross sectional view taken along section line 9A-9A of FIG. 9.

Referring to FIGS. 9 and 9A, a semiconductor component 10P is illustrated. The semiconductor component 10P includes a semiconductor substrate 12P having substrate contacts 26P in electrical communication with integrated circuits, substantially as previously described for substrate 12 (FIG. 1A). The semiconductor component 10P also includes an interposer substrate 14P having terminal contact pads 56P and terminal contacts 34P, substantially as previously described for interposer substrate 14 (FIG. 1B).

The semiconductor component 10P (FIG. 9) also includes a plurality of through interconnects 32P (FIG. 9), which are substantially similar to the previously described through interconnects 32 (FIG. 1B). However, in this case, the through interconnects 32P (FIG. 9) include substrate openings 36P (FIG. 9) having generally cylindrical shapes, and projections 38P (FIG. 9) comprising cylindrical pins having mating cylindrical shapes configured to fit into the substrate openings 36P. As with the previous embodiments, the projections 38P (FIG. 9) can also be adhesively bonded to the substrate openings 36P (FIG. 9). The substrate openings 36P (FIG. 9) can be formed in the semiconductor substrate 12P (FIG. 9) using a dry etch process (e.g., Bosch etch), substantially as previously described for substrate openings 36 (FIG. 1C). The projections 38P (FIG. 9) can also be formed on the interposer substrate 14P made of silicon, using a dry etch process (e.g., Bosch etch), substantially as previously described for projections 38 (FIG. 1C). In addition, either the substrate openings 36P (FIG. 9) or the projections 38P (FIG. 9) (or both) can include electrical insulation layers substantially as previously described. The through interconnects 32P (FIG. 9) also include conductive vias 40P (FIG. 9) through the projections 38P (FIG. 9) in electrical communication with the substrate contacts 26P (FIG. 9), and with the terminal contact pads 56P (FIG. 9).

Figure 10:
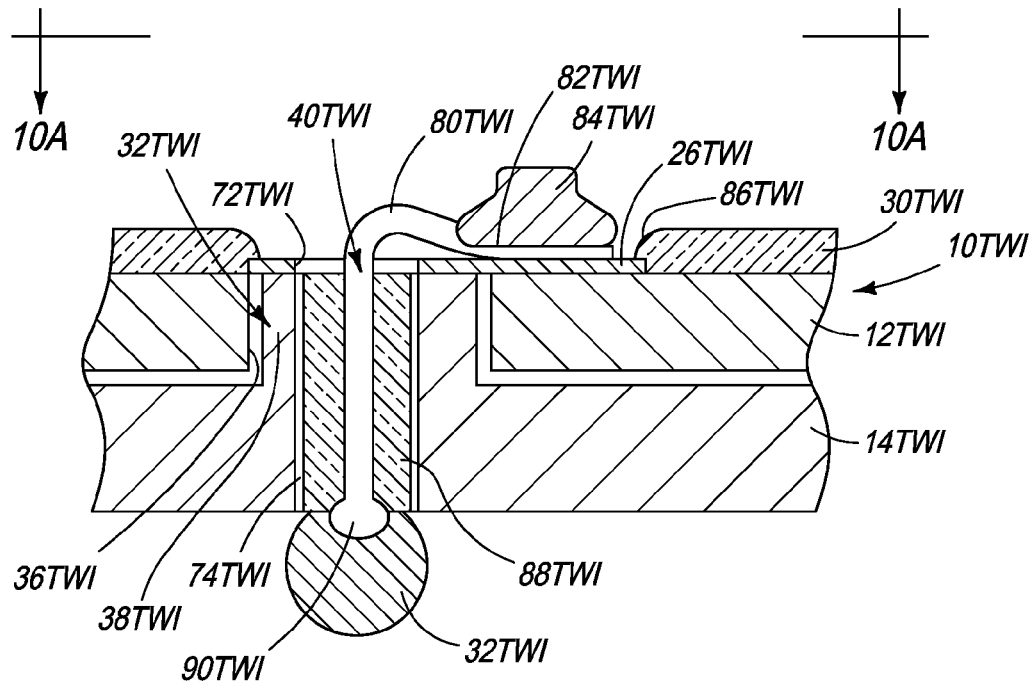
FIG. 10 is a schematic cross sectional view of a semiconductor component having through interconnects.
Figure 10A:
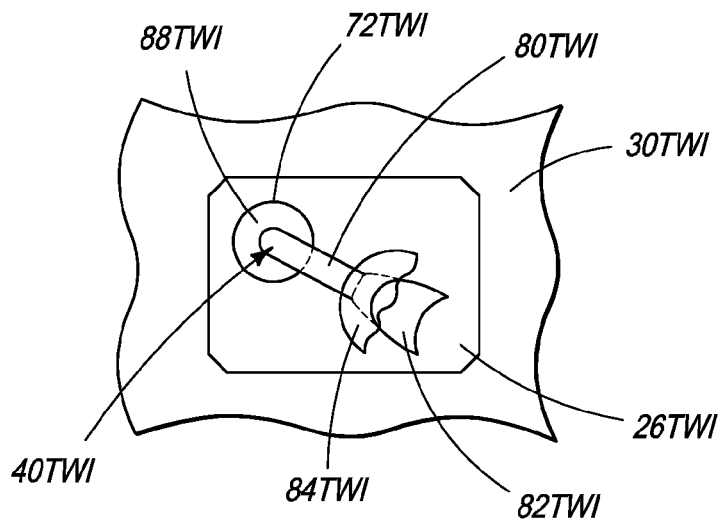
FIG. 10A is a schematic cross sectional view taken along section line 10A-10A of FIG. 10.

Referring to FIGS. 10 and 10A, a semiconductor component 10TWI is illustrated. The semiconductor component 10TWI (FIG. 10) includes a semiconductor substrate 12TWI (FIG. 10) having substrate contacts 26TWI (FIG. 10) in electrical communication with integrated circuits, substantially as previously described for substrate 12 (FIG. 1A). In addition, the substrate contacts 26TWI (FIG. 10) are embedded in an electrical insulation layer 30TWI (FIG. 10) having openings 86TWI (FIG. 10), that align with the substrate contacts 26TWI (FIG. 10). As with the previous embodiments, the substrate contacts 26TWI (FIG. 10) can comprise device bond pads, or redistribution layer (rdl) pads. In addition, the electrical insulation layer 30TWI (FIG. 10) can comprise a die passivation layer, or a redistribution insulating layer.

The semiconductor component 10TWI (FIG. 10) also includes an interposer substrate 14TWI (FIG. 10) having terminal contacts 34TWI (FIG. 10), substantially as previously described for the interposer substrate 14 (FIG. 1B). In addition, the semiconductor component 10TWI (FIG. 10) includes a plurality of through interconnects 32TWI (FIG. 10), that are substantially similar to the previously described through interconnects 32P (FIG. 9). As such, the through interconnects 32TWI (FIG. 10) include cylindrical openings 36TWI (FIG. 10) in the semiconductor substrate 12TWI (FIG. 10) aligned with the substrate contacts 26TWI (FIG. 10). The through interconnects 32TWI (FIG. 10) also include cylindrical pin projections 38TWI (FIG. 10) in the interposer substrate 14TWI (FIG. 10), that mate with the cylindrical openings 36TWI (FIG. 10) in the semiconductor substrate 12TWI (FIG. 10), substantially as previously described.

The through interconnects 32TWI (FIG. 10) also include conductive vias 40TWI (FIG. 10) that comprise through wire interconnects (TWI). The conductive vias 40TWI (FIG. 10) can be constructed substantially as described in U.S. application Ser. No. 11/296,057, filed on Dec. 7, 2005, entitled "Semiconductor Components Having Through Wire Interconnects (TWI), And Method And Systems For Fabricating Semiconductor Components", and in U.S. application Ser. No. 11/102,408, filed on Apr. 8, 2005, entitled "Method And System For Fabricating Semiconductor Components With Through Wire Interconnects", both of which are incorporated herein by reference.

Each conductive via 40TWI (FIG. 10) includes a via 72TWI (FIG. 10) through a substrate contact 26TWI (FIG. 10) on the semiconductor substrate 12TWI (FIG. 10), and through a projection 38TWI (FIG. 10) in the interposer substrate 14TWI (FIG. 10). Each conductive via 40TWI (FIG. 10) also includes a wire 80TWI (FIG. 10) in the via 72TWI (FIG. 10), and a bonded connection 82TWI (FIG. 10) between the wire 80TWI (FIG. 10) and the substrate contact 26TWI (FIG. 10). Each conductive via 40TWI (FIG. 10) can also include a bonding member 72TWI (FIG. 10) on the wire 80TWI (FIG. 10) and the substrate contact 26TWI (FIG. 10), and a dielectric material 88TWI (FIG. 10) in the via 36TWI (FIG. 10).

The via 72TWI (FIG. 10) extends through the substrate contact 26TWI (FIG. 10), and through the full thickness of the interposer substrate 14TWI (FIG. 10). As shown in FIG. 10A, the via 72TWI (FIG. 10) can be offset from the center line of the substrate contacts 26TWI, such as in the left hand corner thereof. In the illustrative embodiment, the via 72TWI (FIG. 10) is generally circular, and has an inside diameter (ID) which is about 1.5 to 3 times larger than the outside diameter (OD) of the wire 80TWI (FIG. 10). By way of example, the wire 80TWI (FIG. 10) can have an outside diameter (OD) of about 25 µm, and the via 72TWI (FIG. 10) can have an inside diameter (ID) of about 37.5 µm to 75 µm. The via 72TWI (FIG. 10) can also include an insulating layer 74TWI (FIG. 10) formed on an inside diameter thereof, substantially as previously described.

The bonded connection 82TWI (FIG. 10A) can be formed between a first end of the wire 80TWI (FIG. 10) and the substrate contact 26TWI (FIG. 10). The bonded connection 82TWI (FIG. 10) can comprise a ball bond formed using a wire bonding process, such as thermosonic wire bonding, or alternately a wedge bond formed using ultrasonic wire bonding. In addition, the second end of the wire 80TWI (FIG. 10) can include a generally spherically shaped contact ball 90TWI (FIG. 10), such as a "free air ball" formed using an electronic flame off (EFO) process. Further, the terminal contact 34TWI (FIG. 10) can be formed directly on the contact ball 90TWI (FIG. 10) using a suitable bonding or deposition process. For some applications the contact ball 90TWI (FIG. 10) can be omitted, and the terminal contact 34TWI (FIG. 10) formed directly on the end of the wire 80TWI (FIG. 10). In addition, the wire 80TWI (FIG. 10) and the bonding member 84TWI (FIG. 10) as well, can include a metal coating such as an electrolessly deposited metal such as Ni or Pd on Al configured to stiffen the wire 80TWI (FIG. 10) and increase the height of the bonding member 84TWI (FIG. 10).

The dielectric material 88TWI (FIG. 10) is configured to surround, insulate and secure the wire 80TWI (FIG. 10) in the via 72TWI (FIG. 10). The dielectric material 88TWI (FIG. 10) can comprise a polymer material such as polyimide, deposited using a suitable process, such as deposition through a nozzle, or deposition using a material dispensing system. For some applications the dielectric material 88TWI (FIG.

10) can be omitted. The bonding member 84TWI (FIG. 10) is configured to secure the wire 80TWI (FIG. 10) to the substrate contact 26TWI (FIG. 10), and to provide a bonding structure for bonding the semiconductor component 10TWI (FIG. 10) to other components. The bonding member 84TWI (FIG. 10) can comprise a stud bump, or a ball bump formed using a wire bonder, a stud bumper, or a ball bumper. Alternately, the bonding member 84TWI (FIG. 10) can comprise a solder joint, a welded connection, or a conductive polymer connection, formed using a bonding process, such as thermal or pressure bonding. For some applications, the bonding member 84TWI (FIG. 10) can be omitted.

To fabricate the semiconductor component 10TWI (FIG. 10), the semiconductor substrate 12TWI (FIG. 10) and the interposer substrate 14TWI (FIG. 10), can be fabricated, then aligned and placed together substantially as previously described. The conductive via 40TWI (FIG. 10) can be fabricated by forming the via 72TWI (FIG. 10) through the substrate contact 26TWI (FIG. 10), and part way through the interposer substrate 14TWI (FIG. 10), then placing the wire 80TWI (FIG. 10) in the via 40TWI (FIG. 10), and the bonding the wire 80TWI (FIG. 10) to the substrate contact 26TWI (FIG. 10) to form the bonded connection 82TWI (FIG. 10).

The fabrication method can also includes the step of placing the dielectric material 88TWI (FIG. 10) in the via 72TWI (FIG. 10). The dielectric material 88TWI (FIG. 10) can comprise an electrically insulating curable polymer, such as a polyimide, an epoxy or a silicone. Suitable curable polymers are manufactured by Shinitsu of Japan, and Dexter Electronic Materials of Rocky Hill, Conn. Following curing, the dielectric material 88TWI (FIG. 10) provides a potting structure which secures and electrically insulates the wire 80TWI (FIG. 10) in the via 40TWI (FIG. 10).

The dielectric material 80TWI (FIG. 10) can be injected into the via 40TWI (FIG. 10) in a viscous state, pulled by capillary action by vacuum directed through a vent, and then cured. For example, a positive displacement mechanism such as a syringe, can be used to dispense a quantity of the dielectric material 80TWI (FIG. 10) in a viscous state into the via 40TWI (FIG. 10). Other suitable deposition processes for depositing the dielectric material 80TWI (FIG. 10) into the via 40TWI (FIG. 10) include screen printing, stenciling and stereographic lithography. The dielectric material 80TWI (FIG. 10) can also be deposited into the via 40TWI (FIG. 10) using a film assisted molding equipment (FAME) process to be further described.

The fabrication method can also includes the steps of thinning the interposer substrate 14TWI (FIG. 10) from the back side to expose the contact ball 90TWI (FIG. 10), and then forming the bonding member 84TWI (FIG. 10) on the bonded connection 82TWI (FIG. 10) and the substrate contact 26TWI (FIG. 10). Further details of the fabrication process are disclosed in the previously incorporated U.S. application Ser. Nos. 11/296,057 and 11/102,408.

Figure 8:
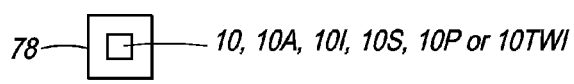
FIG. 8 is a schematic drawing of a system containing a semiconductor component having through interconnects.

Referring to FIG. 8, the semiconductor components 10 (FIG. 1A), 10A (FIG. 5A), 10 (FIG. 6), 10S (FIG. 7), 10P (FIG. 9) or 10TWI (FIG. 10) can be used as stand alone devices, or in combination with other semiconductor components to fabricate semiconductor systems 78 (FIG. 8). The semiconductor systems 78 (FIG. 8) can include singulated components bonded to one another (singulated system), or singulated semiconductor components bonded to a semiconductor wafer (wafer system), or semiconductor components contained on a semiconductor wafer bonded to another semiconductor wafer (wafer to wafer system). With each system, the through interconnects 32 (FIG. 1B), 32A (FIG. 5B), 32I (FIG. 6), 32S (FIG. 7), 32P (FIG. 9), or 32TWI (FIG. 10) provide a signal transmission system, and bonding structures between adjacent stacked components and next level substrates as well.

Figure 11A:
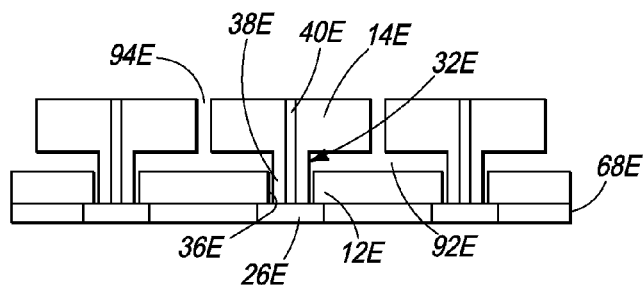
FIGS. 11A-11I are schematic cross sectional views illustrating steps in a method for fabricating an encapsulated semiconductor component having through interconnects.

Referring to FIGS. 11A-11I, steps in a method for fabricating an encapsulated semiconductor component 10E (FIG. 11I) with through interconnects 32E (FIG. 11I) is illustrated. Initially, as shown in FIG. 11A, a semiconductor wafer 68E containing a plurality of semiconductor substrates 12E can be provided. The semiconductor substrates 12E include integrated circuits, and substrate contacts 26E in electrical communication with the integrated circuits, substantially as previously described for the semiconductor substrate 12 (FIG. 1B). The semiconductor substrates 12E also include substrate openings 36E aligned with the substrate contacts 26E, substantially as previously described for any of the previously described substrate openings (e.g., 36—FIG. 2C).

As also shown in FIG. 11A, a plurality of singulated semiconductor substrates 14E are provided. The singulated semiconductor substrates 14E (FIG. 11A) can comprise semiconductor dice, such as known good dice (KGD), having integrated circuits in a desired electrical configuration (e.g., DRAM). The singulated semiconductor substrates 14E (FIG. 11A) also include projections 38E (FIG. 11A) having conductive vias 40E (FIG. 11A) in electrical contact with the substrate contacts 26E (FIG. 11A) on the semiconductor substrates 12E (FIG. 11A). The projections 38E (FIG. 11A) can be substantially similar to any of the previously described projections (e.g., 38, 38A, 38I, 38S, 38P, 38TWI). In addition, the conductive vias 40E (FIG. 11A) can be substantially similar to any of the previously described conductive vias (e.g., 40, 40A, 40I, 40S, 40P, 40TWI). The projections 38E (FIG. 11A) and the conductive vias 40E (FIG. 11A), in combination with the substrate openings 36E (FIG. 11A) and the substrate contacts 26E (FIG. 11A), form through interconnects 32E (FIG. 11A). The through interconnects 32E can be substantially similar to any of the previously described through interconnects (e.g., 32, 32A, 32S, 32P, 32TWI). However in this embodiment, the projections 38E (FIG. 11A) and the substrate openings 36E (FIG. 11A) are configured such that spaces 92E (FIG. 11A) are formed between the singulated semiconductor substrates 14E (FIG. 11A) and the semiconductor wafer 68E (FIG. 11A).

As also shown in FIG. 11A, the singulated semiconductor substrates 14E (FIG. 11A) can be placed on the semiconductor wafer 68E (FIG. 11A), such that spaces 94E (FIG. 11A) are also formed between the semiconductor substrates 14E (FIG. 11A). The singulated semiconductor substrates 14E (FIG. 11A) can be placed on the semiconductor wafer 68E (FIG. 11A) using an alignment device, a pick and place mechanism, or other suitable apparatus. U.S. Pat. No. 7,060,526 to Farnworth et al., which is incorporated herein by reference, further describes processes for mounting singulated dice to a base wafer, and additional processes as well, which are similar to steps of the present method. Following placement of the singulated semiconductor substrates 14E (FIG. 11A) on the semiconductor wafer 68E (FIG. 11A), the conductive vias 40E (FIG. 11A) can be bonded to the substrate contacts 26E (FIG. 11A), substantially as previously described for any of the previously described through interconnects (e.g., 32, 32A, 32S, 32P, 32TWI).

Figure 11B:
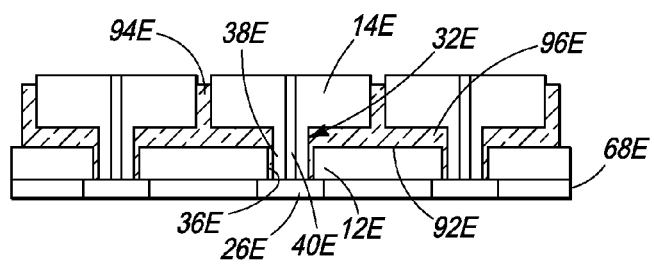

Next, as shown in FIG. 11B, a polymer fill step is performed in which an underfill polymer 96E (FIG. 11B) is placed in the spaces 92E (FIG. 11A) between the singulated substrates 14E and the semiconductor wafer 68E, and in the spaces 94E (FIG. 11A) between the singulated semiconductor substrates 14E (FIG. 11A). The underfill polymer 96E (FIG. 11B) functions to bond the singulated semiconductor substrates 14E (FIG. 11B) to the semiconductor wafer 68E (FIG. 11B). In addition, the underfill polymer 96E (FIG. 11B) encapsulates the edges of the completed semiconductor components 10E (FIG. 1I). The underfill polymer 96E (FIG. 11B) can comprise a conventional underfill polymer such as a curable silicone, epoxy or polyimide material. For example, suitable underfill polymer materials are manufactured by Dexter Electronic Materials, City of Industry, CA under the trademark "HYSOL". The underfill polymer 96E can be deposited on the semiconductor wafer 68E (FIG. 11B) in a viscous state using a conventional deposition apparatus, such as a material dispensing system having a computer controlled nozzle. One suitable system is manufactured by Asymtek of Carlsbad, Calif. In addition, one or more dams (not shown) can be formed on the semiconductor wafer 68E (FIG. 11B) for containing the viscous underfill polymer material. Further, a pressure chamber can be used to distribute and draw the under fill polymer 96E (FIG. 11B) into the spaces 92E, 94E (FIG. 11A) using vacuum and pressure. The underfill polymer 96E (FIG. 11B) can then be cured using a suitable curing process.

Figure 11C:
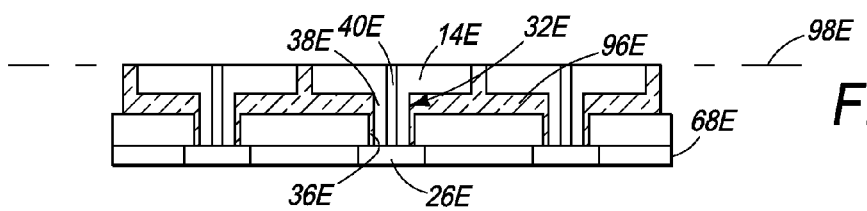

Next, as shown in FIG. 11C, a planarizing and thinning step can be performed to planarize and thin the singulated semiconductor substrates 14E (FIG. 11C) to a common plane 98E. This step can be performed using a suitable process, such as grinding, chemical mechanical planarization (CMP) or etching. A representative thickness of the singulated semiconductor substrate 14E can be from 10 μm to 725 μm.

Figure 11D:
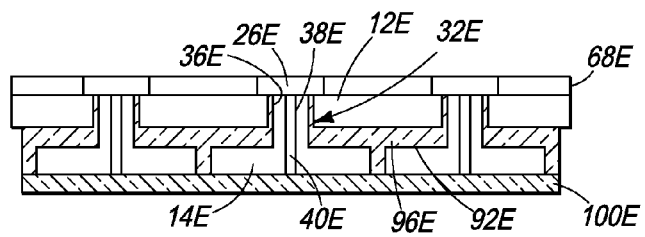

Next, as shown in FIG. 11D, the semiconductor wafer 68E can be flipped, and a first encapsulation step can be performed. The first encapsulation step can be performed using a compression mold process, such as a film assisted molding equipment (FAME) process. Equipment for performing film assisted molding equipment (FAME) is available from Boschman Industries of Holland, and APIC Yamada America, Chandler, Ariz. With a film assisted molding equipment (FAME) process a clamp ring, a release film, and a compression mold system, can be used to mold a first encapsulating layer 100E (FIG. 11D), which encapsulates the singulated semiconductor substrates 14E (FIG. 11D) on the semiconductor wafer 68E (FIG. 11D). The first encapsulating layer 100E (FIG. 11D) can initially comprise a suitable powder mold compound that is placed on the semiconductor wafer 68E (FIG. 11D) and then compression molded to a desired shape. In addition, soluble eye point dams (not shown) can cover alignment marks on the semiconductor wafer 68E (FIG. 11D), and can be removed following formation of the first encapsulating layer 100E (FIG. 11D) to provide alignment of the semiconductor wafer 68E during subsequent processing. Further, if the through interconnects 32E (FIG. 11D) comprise through wire interconnects (e.g., 32TWI—FIG. 10), the first encapsulating layer 100E can also be molded into vias (e.g., 72TWI—FIG. 10) to form the dielectric material (e.g., 88TWI—FIG. 10) for the through wire interconnects (TWI). A representative thickness of the first encapsulating layer 100E (FIG. 11D) can be from 25 μm to 150 μm. Following the compression molding process, the first encapsulating layer 100E can be cured using a suitable process.

Figure 11E:
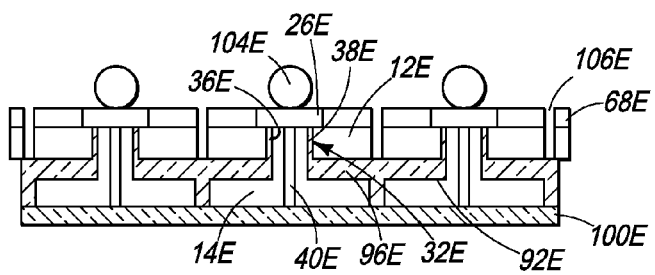

Next, as shown in FIG. 11E, contact bumps 104E are formed on the substrate contacts 26E (FIG. 11E), or alternately on redistribution pads (not shown), in electrical communication with the substrate contacts 26E (FIG. 11E). The contact bumps 104E (FIG. 11E) can comprise metal bumps deposited on the substrate contacts 26E (FIG. 11E) using a suitable deposition process, such as stenciling and reflow of a metal alloy onto the substrate contacts 26E (FIG. 11E). The contact bumps 104E (FIG. 11E) can comprise solder, another metal such as Cu, Au or Ni, or a conductive polymer material.

As also shown in FIG. 11E, a scribing step can be performed in which grooves 106E (FIG. 11E) are formed in the semiconductor wafer 68E (FIG. 11E) in the streets between the individual semiconductor substrates 12E (FIG. 11E) on the semiconductor wafer 68E (FIG. 11E). The scribing step can be performed using a dicing saw having saw blades set to penetrate through the semiconductor wafer 68E (FIG. 11E) to the polymer underfill layer 96E (FIG. 11E). The scribing step can also be performed by etching the grooves 106E (FIG. 11E) using a wet etching process, a dry etching process or a plasma etching process. U.S. Pat. No. 7,029,949 to Farnworth et al., which is incorporated herein by reference, further describes details of a scribing step.

Figure 11F:
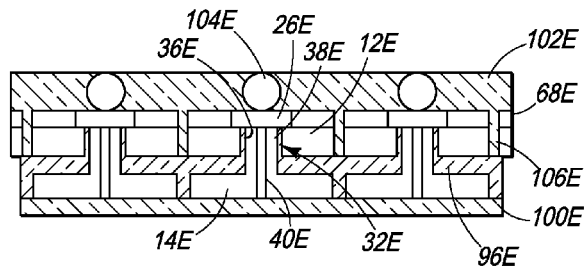

Next, as shown in FIG. 11F, a second encapsulating step can be performed to form a second encapsulating layer 102E (FIG. 11F) on the circuit side of the semiconductor wafer 68E (FIG. 11F). The second encapsulating layer 102E (FIG. 11F) also encapsulates the contact bumps 104E (FIG. 11F), and fills the grooves 106E (FIG. 11F) formed during the scribing step. The second encapsulating step can be performed using a film assisted molding equipment (FAME) process substantially as previously described for forming the first encapsulating layer 100E (FIG. 11F).

Figure 11G:
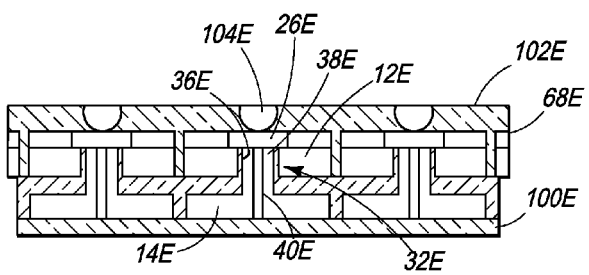

Next, as shown in FIG. 11G, a second planarizing step is performed to planarize the contact bumps 104E (FIG. 11G) and the second encapsulating layer 102E (FIG. 11G) to a common planar surface. This step can be performed using suitable process such as grinding, chemical mechanical planarization (CMP) or etching, substantially as previously described for the planarizing and thinning step (FIG. 1C). In addition, previously incorporated U.S. Pat. No. 7,060,526 to Farnworth et al., further describes a planarizing step.

Figure 11H:
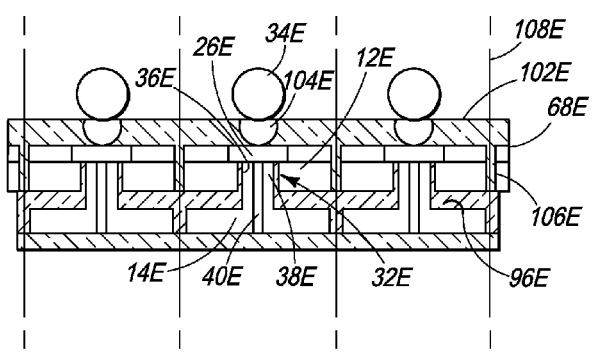

Next, as shown in FIG. 11H, a terminal contact forming step is performed in which terminal contacts 34E (FIG. 11H) are formed on the planarized contact bumps 104E (FIG. 11H). The terminal contacts 34E (FIG. 11H) are also sometimes referred to in the art as outer lead bonds (OLB). Conversely, the through interconnects 32E (FIG. 11H) are sometimes referred to as the inner lead bonds (ILB). The terminal contacts 34E (FIG. 11H) can comprise metal, or solder, balls, bumps or pins, formed using a metallization process, a stud bumping process or a ball bonding process. A representative range for the diameter of the terminal contacts 34E (FIG. 11H) can be from 60-500 μm.

As also shown in FIG. 11H, a singulating step can be performed in which singulating cuts 108E (FIG. 1H) are formed through the first and second encapsulating layers 100E, 102E (FIG. 1H), through the polymer filled grooves 106E (FIG. 1H) and through the polymer underfill layer 96E (FIG. 1H). The singulating step can be performed using a dicing saw configured to dice semiconductor wafers into individual dice. Alternately, rather than by sawing, the singulating step can be performed using another singulation method, such as cutting with a laser or a water jet, or by etching with a suitable wet or dry etchant.

Figure 11I:
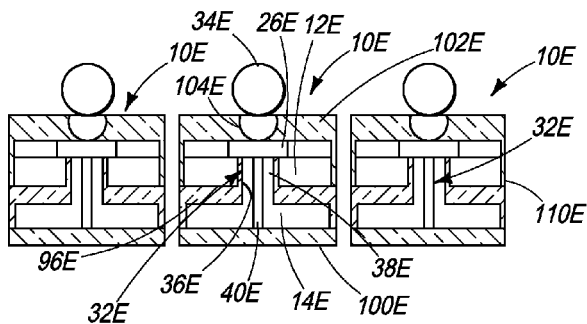

As shown in FIG. 11I, the singulating step forms a plurality of individual semiconductor components 10E (FIG. 1I) which are encapsulated on six sides (6×). Each semiconductor component 10E (FIG. 1I) includes a first semiconductor substrate 12E (FIG. 1I) and a second semiconductor substrate 14E (FIG. 1I) bonded to one another by the polymer underfill layer 96E (FIG. 11B). Each semiconductor component 10E (FIG. 1I) also includes a plurality of through interconnects 32E, which form an internal signal transmission system between the semiconductor substrates 12E, 14E (FIG.

1I). Each semiconductor component 10E (FIG. 11I) also includes the first encapsulating layer 100E (FIG. 11I), which encapsulates the front of the component 10E (FIG. 11I), and the second encapsulating layer 102E (FIG. 11I), which encapsulates the back of the component 10E (FIG. 11I). In addition, each semiconductor component 10E (FIG. 11I) includes edge encapsulating layers 110E (FIG. 11I), which are formed by portions of the second encapsulating layer 102E in the grooves 106E (FIG. 11E), and by portions of the polymer underfill layer 96E (FIG. 11B) aligned with the grooves 106E (FIG. 11E).

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A method for fabricating a semiconductor component comprising:
   providing a first substrate having a first side, a second side, and a substrate contact on the first side;
   forming an opening from the second side to the substrate contact;
   providing a second substrate;
   forming a projection on the second substrate and a conductive via in the projection; and
   placing the second substrate on the second side of the first substrate with the projection in the opening and the conductive via in electrical contact with the substrate contact.

2. The method of claim 1 further comprising bonding the projection to the substrate contact.

3. The method of claim 1 wherein the forming the opening step comprises a first etching process and the forming projection step comprises a second etching process.

4. The method of claim 1 wherein the projection and the opening have matching sizes and shapes configured for mating physical engagement.

5. The method of claim 1 wherein the first substrate comprises a semiconductor die and the second substrate comprises an interposer substrate.

6. The method of claim 1 wherein the first substrate comprises a first semiconductor die and the second substrate comprises a second semiconductor die.

7. The method of claim 1 further comprising forming a terminal contact on the second substrate in electrical communication with the conductive via.

8. The method of claim 1 wherein the opening and the projection are generally conical in shape and the projection fits into the opening.

9. The method of claim 1 wherein the opening has a generally concave shape and the projection has a generally convex shape which fits into the opening.

10. The method of claim 1 wherein the opening and the projection are generally cylindrical in shape and the projection fits into the opening.

11. The method of claim 1 wherein the conductive via includes a contact on the projection and further comprising bonding the contact to the inner surface of the substrate contact.

12. The method of claim 1 wherein the conductive via comprises a wire and further comprising bonding the wire to the substrate contact.

13. The method of claim 1 wherein the conductive via comprises a wire and further comprising forming a bonding member on the wire and the substrate contact.

14. The method of claim 1 wherein the conductive via comprises a wire and further comprising forming a contact ball on the wire, and forming a terminal contact on the contact ball.

15. The method of claim 1 wherein the conductive via comprises a wire and further comprising forming a dielectric material in the conductive via to secure the wire.

16. The method of claim 1 wherein the conductive via comprises a wire and further comprising depositing a dielectric material in the conductive via using a film assisted molding (FAME) process.

17. The method of claim 1 wherein the conductive via comprises a wire and further comprising electrolessly depositing a metal layer on the wire to strengthen the wire.

18. The method of claim 1 further comprising encapsulating the first substrate, the second substrate and edges of the first substrate and the second substrate.

19. The method of claim 1 wherein the first substrate includes at least one integrated circuit in electrical communication with the substrate contact.

20. The method of claim 1 wherein the first substrate includes at least one first integrated circuit in electrical communication with the substrate contact, and the second substrate includes at least one second integrated circuit in electrical communication with the conductive via.

21. A method for fabricating a semiconductor component comprising:
   providing a first substrate having integrated circuits and substrate contacts in electrical communication with the integrated circuits;
   forming openings from a backside of the substrate aligned with the substrate contacts;
   forming a plurality of projections on a second substrate and conductive vias in the projections;
   placing the projections into the openings; and
   placing the conductive vias in electrical contact with the substrate contacts.

22. The method of claim 21 further comprising bonding the projections to the substrate contacts.

23. The method of claim 21 further comprising bonding the conductive vias to the substrate contacts.

24. The method of claim 21 further comprising forming terminal contacts on the second substrate in electrical communication with the conductive vias.

25. The method of claim 21 wherein the forming the openings step comprises anisotropic etching and the openings are generally conical shaped.

26. The method of claim 21 wherein the forming the projections step comprises anisotropic etching and the projections are generally conical shaped.

27. The method of claim 21 wherein the forming the openings step comprises isotropic etching and the openings are generally hemispherical shaped.

28. The method of claim 21 wherein the forming the projections step comprises isotropic etching and the projections are generally hemispherical shaped.

29. The method of claim 21 wherein the forming the openings step comprises dry etching and the openings are generally cylindrical shaped.

30. The method of claim 21 wherein the forming the projections step comprises dry etching and the projections are generally cylindrical shaped.

31. The method of claim 21 wherein the first substrate comprises an imager die and further comprising forming a transparent substrate on the first substrate.

32. The method of claim 21 wherein the first substrate and the second substrate have a space therebetween and further comprising filling the space with a polymer material.

33. The method of claim 21 wherein the first substrate and the second substrate comprise semiconductor dice and further comprising configuring the dice as a system in a package.

34. The method of claim 21 wherein the first substrate is contained on a first semiconductor wafer and the second substrate is contained on a second semiconductor wafer.

35. The method of claim 21 wherein the first substrate is contained on a semiconductor wafer and the second substrate comprises a semiconductor die attached to the semiconductor wafer.

36. A method for fabricating a semiconductor component comprising:
   providing a first substrate having a circuit side, a back side, a plurality of integrated circuits, and a plurality of substrate contacts on the circuit side in electrical communication with the integrated circuits;
   providing a second substrate;
   forming openings in the back side of the first substrate to the substrate contacts;
   forming projections on the second semiconductor substrate, the projections and the openings having matching sizes and shapes configured for mating physical engagement;
   forming conductive vias through the projections; and
   placing the projections in physical contact with the openings and the conductive vias in electrical contact with the substrate contacts.

37. The method of claim 36 further comprising bonding the projections to the substrate contacts.

38. The method of claim 36 further comprising forming contacts on the conductive vias and bonding the contacts to the substrate contacts.

39. The method of claim 36 further comprising forming terminal contacts on the second substrate in electrical communication with the conductive vias.

40. The method of claim 36 wherein the forming the openings step comprises anisotropic etching, isotropic etching or dry etching.

41. The method of claim 36 wherein the forming the projections step comprises anisotropic etching, isotropic etching or dry etching.

42. A method for fabricating a semiconductor component comprising:
   providing a first substrate having a circuit side, a back side, an integrated circuit, a substrate contact on the circuit side in electrical communication with the integrated circuit;
   etching a substrate opening in the back side to an inner surface of the substrate contact;
   providing a second substrate;
   etching a projection on the second substrate configured for mating physical engagement with the opening;
   forming a conductive via through the projection and the second substrate having a contact on projection;
   placing the projection in the opening; and
   bonding the contact to the substrate contact.

43. The method of claim 42 further comprising forming a terminal contact on the second substrate or on the first substrate in electrical communication with the conductive via.

44. The method of claim 42 wherein the first substrate is contained on a first wafer and the second substrate is contained on a second wafer and further comprising singulating the first wafer and the second wafer following the bonding step.

45. The method of claim 42 further comprising forming an insulation layer in the opening prior to the placing step.

46. The method of claim 42 further comprising forming an insulation layer on the projection prior to the placing step.

47. The method of claim 42 wherein the bonding step comprises heating the contact and the substrate contact.

48. The method of claim 42 wherein the bonding step comprises applying ultrasonic energy to the contact and to the substrate contact.

49. The method of claim 42 wherein the bonding step comprise depositing and curing a conductive adhesive layer.

50. The method of claim 42 wherein the bonding step comprise attaching a wire to the substrate contact.

51. The method of claim 42 wherein the bonding step comprises forming a bonding member between a wire and the substrate contact.

52. A method for fabricating a semiconductor component comprising:
   providing a semiconductor wafer comprising a plurality of first semiconductor substrates having a plurality of substrate contacts and openings aligned with the substrate contacts;
   providing a plurality of second semiconductor substrates having a plurality of projections and through interconnects in the projections;
   placing the second semiconductor substrates on the semiconductor wafer with the projections in the openings, the through interconnects in electrical contact with the substrate contacts, and spaces between the second semiconductor substrates and between the second semiconductor substrates and the semiconductor wafer;
   filling the spaces with a first polymer material;
   forming grooves in the semiconductor wafer;
   encapsulating the second semiconductor substrates and filling the grooves with a second polymer material; and
   singulating the semiconductor wafer through the grooves.

53. The method of claim 52 wherein the encapsulating step comprises a film assisted molding (FAME) process.

54. The method of claim 52 further comprising encapsulating a side of the semiconductor wafer using a second film assisted molding equipment (FAME) process.

55. The method of claim 52 wherein the through interconnnects comprise insulated vias at least partially filled with a metal.

56. The method of claim 52 wherein the through interconnects comprise wires in vias bonded to the substrate contacts.

57. The method of claim 52 wherein the through interconnects include vias and a dielectric material in the vias comprising the second polymer material molded into the vias during the encapsulating step.

58. The method of claim 52 further comprising forming contact bumps on the substrate contacts embedded in the second polymer material and terminal contacts on the contact bumps.

59. The method of claim 52 further comprising planarizing and thinning the second semiconductor substrates on the semiconductor wafer prior to the encapsulating step.

* * * * *

UNITED STATES PATENT AND TRADEMARK OFFICE
CERTIFICATE OF CORRECTION

PATENT NO. : 7,833,832 B2  Page 1 of 1
APPLICATION NO. : 12/412906
DATED : November 16, 2010
INVENTOR(S) : Alan G. Wood et al.

It is certified that error appears in the above-identified patent and that said Letters Patent is hereby corrected as shown below:

In column 24, lines 48-49, in Claim 55, delete "interconnnects" and insert -- interconnects --, therefor.

Signed and Sealed this
Eleventh Day of January, 2011

David J. Kappos
*Director of the United States Patent and Trademark Office*